(12) United States Patent
Shimazawa et al.

(10) Patent No.: US 8,014,108 B2
(45) Date of Patent: Sep. 6, 2011

(54) MAGNETORESISTIVE DEVICE OF THE CPP TYPE, UTILIZING INSULATING LAYERS INTERPOSED IN SHIELD LAYERS TO FORM A CLOSED MAGNETIC PATH USABLE IN A DISK SYSTEM

(75) Inventors: Koji Shimazawa, Tokyo (JP); Tsutomu Chou, Tokyo (JP); Daisuke Miyauchi, Tokyo (JP)

(73) Assignee: TDK Corporation, Tokyo (JP)

( * ) Notice: Subject to any disclaimer, the term of this patent is extended or adjusted under 35 U.S.C. 154(b) by 805 days.

(21) Appl. No.: 12/028,243

(22) Filed: Feb. 8, 2008

(65) Prior Publication Data
US 2009/0201612 A1 Aug. 13, 2009

(51) Int. Cl.
*G11B 5/39* (2006.01)
(52) U.S. Cl. .............. 360/319; 360/324.11; 360/324.12; 360/324.2
(58) Field of Classification Search .................. 360/319, 360/324.11–324.2
See application file for complete search history.

(56) References Cited

U.S. PATENT DOCUMENTS
7,436,634 B2 * 10/2008 Carey et al. .................. 360/319
2007/0274011 A1 11/2007 Ohta et al.

FOREIGN PATENT DOCUMENTS
| JP | 7-44826 | 2/1995 |
| JP | 2002-123912 | 4/2002 |
| JP | 2004-319709 | 11/2004 |
| JP | 2007-317269 | 12/2007 |

OTHER PUBLICATIONS
U.S. Appl. No. 12/255,105, filed Oct. 21, 2008, Chou, et al.
U.S. Appl. No. 12/019,202, filed Jan. 24, 2008, Machita, et al.
U.S. Appl. No. 12/019,205, filed Jan. 24, 2008, Machita, et al.

* cited by examiner

*Primary Examiner* — A. J. Heinz
(74) *Attorney, Agent, or Firm* — Oblon, Spivak, McClelland, Maier & Neustadt, L.L.P.

(57) ABSTRACT

The invention provides a magnetoresistive device of the CPP (current perpendicular to plane) structure, comprising a magnetoresistive unit, and a first shield layer and a second shield layer which are located and formed such that the magnetoresistive unit is sandwiched between them from above and below, with a sense current applied in the stacking direction, wherein said magnetoresistive unit comprises a non-magnetic intermediate layer, and a first ferromagnetic layer and a second ferromagnetic layer stacked and formed such that said nonmagnetic intermediate layer is sandwiched between them.

19 Claims, 23 Drawing Sheets

FIG. 4
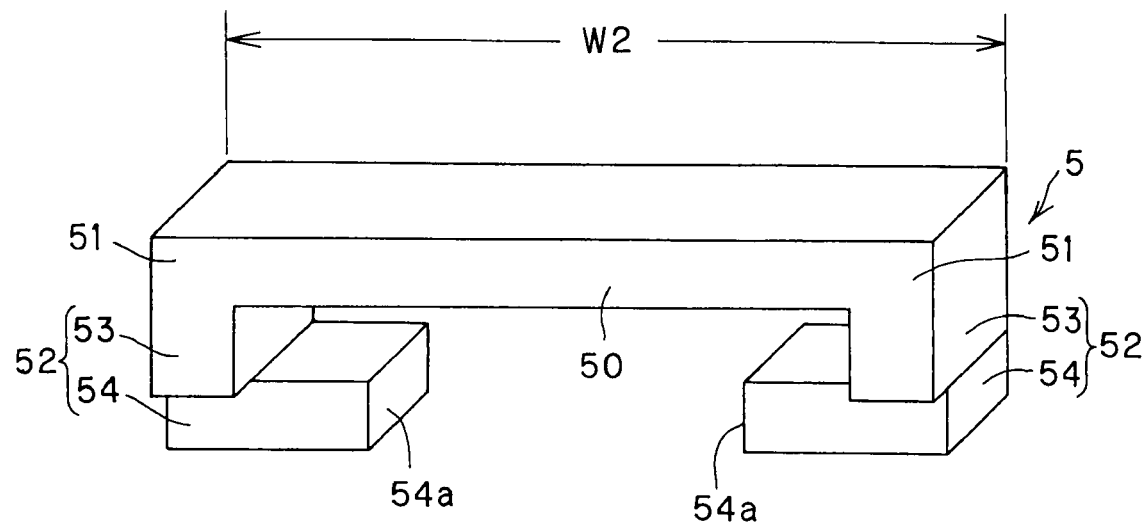
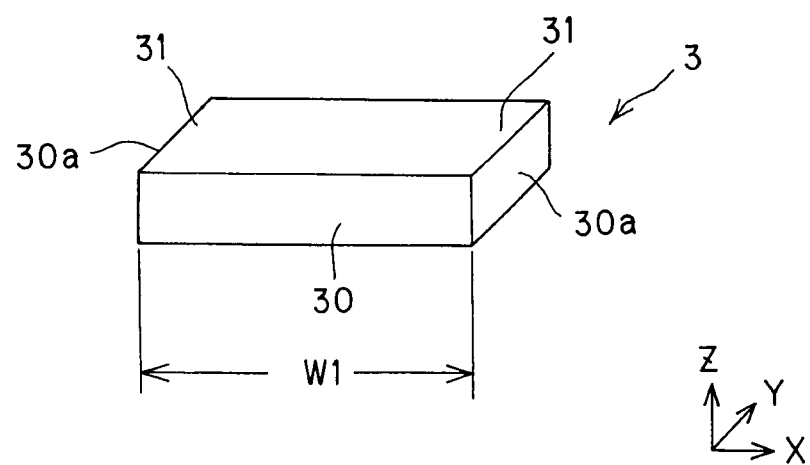

FIG. 5
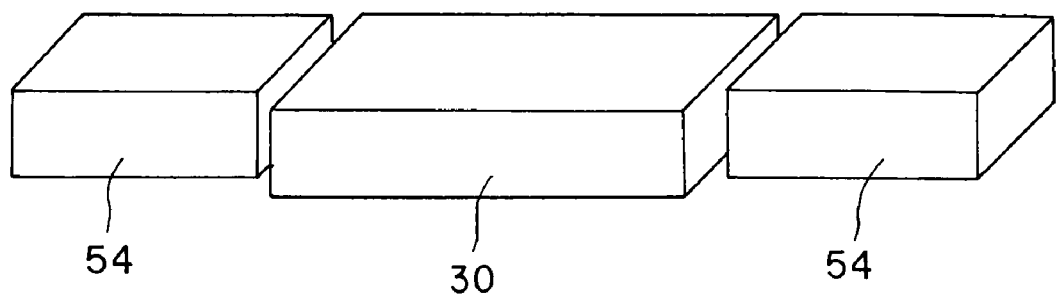
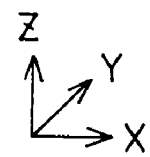

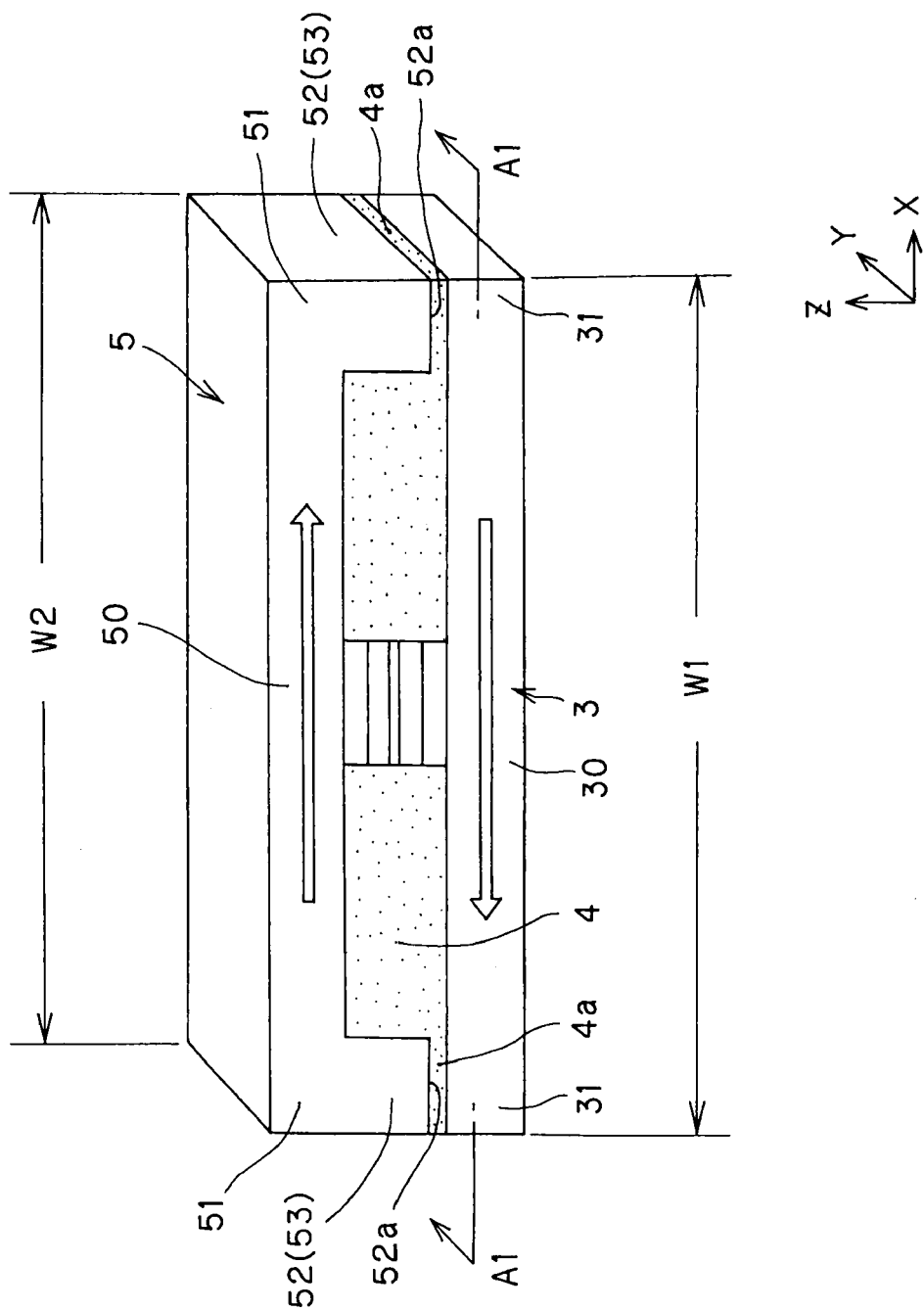

FIG.19
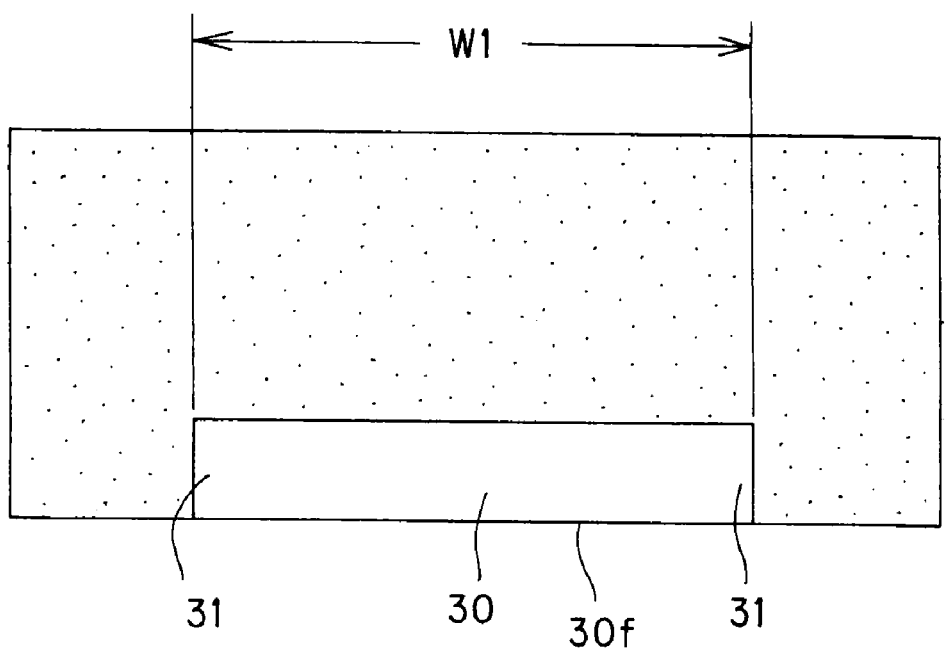
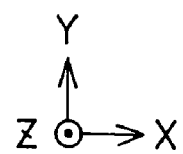

FIG. 20
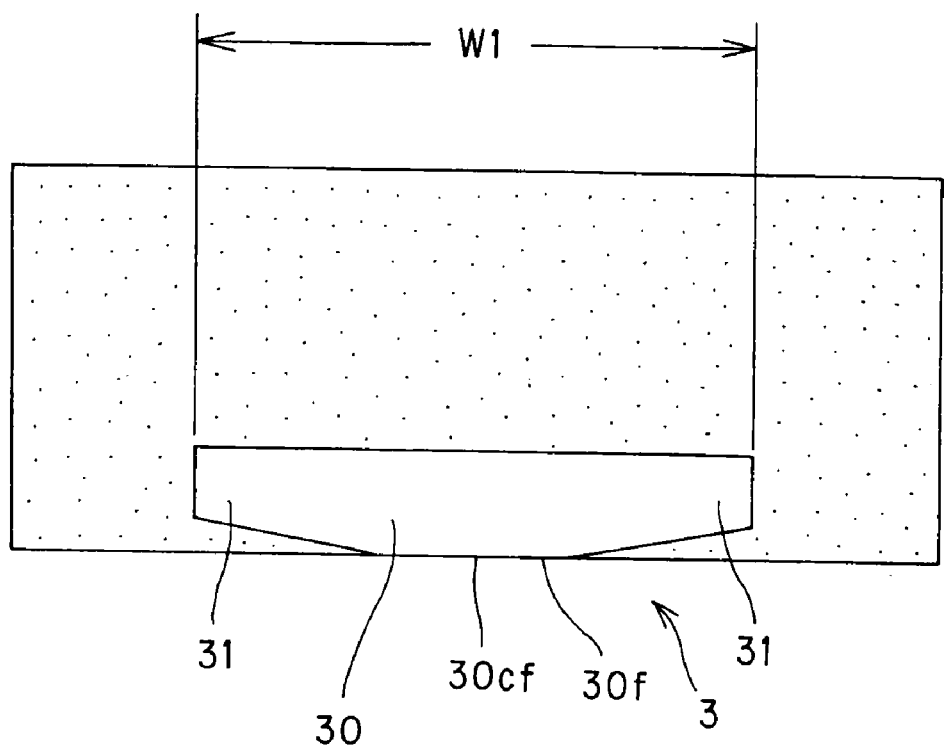
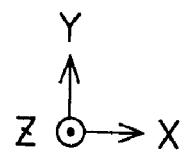

MAGNETORESISTIVE DEVICE OF THE CPP TYPE, UTILIZING INSULATING LAYERS INTERPOSED IN SHIELD LAYERS TO FORM A CLOSED MAGNETIC PATH USABLE IN A DISK SYSTEM

BACKGROUND OF THE INVENTION

1. Field of the Invention

The present invention relates to a magnetoresistive device adapted to read the magnetic field intensity of magnetic recording media or the like as signals, and a thin-film magnetic head comprising that magnetoresistive device as well as a head gimbal assembly and a magnetic disk system, one each including that thin-film magnetic head.

2. Explanation of the Prior Art

In recent years, with an increase in the recording density of hard disks (HDDs), there have been growing demands for improvements in the performance of thin-film magnetic heads. For the thin-film magnetic head, a composite type thin-film magnetic head has been widely used, which has a structure wherein a reproducing head having a read-only magnetoresistive device (hereinafter often called the MR device for short) and a recording head having a write-only induction type magnetic device are stacked together.

The magnetoresistive device (CIP-GMR device) of the so-called CIP (current in plane) structure that operates on currents flowing parallel with the film plane of the device—called a spin valve GMR device—is now widely employed as the reproducing head. The spin valve GMR device of such structure is positioned between upper and lower shield layers one each formed of a soft magnetic metal film, and sandwiched between insulating layers called gap layers. Recording density in the bit direction is determined by the gap (read gap length) between the upper and lower shield layers.

With an increase in the recording density, there has been a growing demand for the reproducing device of the reproducing head to have narrower shield gaps and narrower tracks. As the reproducing head track grows narrow with a decreasing device height, so does the device area; however, with the prior art structure, there is an operating current limited from the standpoint of reliability, because there is heat dissipation efficiency decreasing with a decreasing area.

To solve such a problem, there is a GMR device of the CPP (current perpendicular to plane) structure (CPP-GMR device) proposed in the art, in which upper and lower shield layers and a magnetoresistive device are connected electrically in series to make do without any insulating layer between the shields. This technology is thought of as inevitable to achieve such recording densities as exceeding 200 Gbits/in$^2$.

Such a CPP-GMR device has a multilayer structure comprising a first ferromagnetic layer and a second ferromagnetic layer between which an electroconductive, nonmagnetic intermediate layer is sandwiched from both its sides. A typical multilayer structure for the spin valve type CPP-GMR device comprises, in order from a substrate side, a lower electrode/antiferromagnetic layer/first ferromagnetic layer/electroconductive, nonmagnetic intermediate layer/second ferromagnetic layer/upper electrode stacked together in order.

The direction of magnetization of the first ferro-magnetic layer that is one of the ferromagnetic layers remains fixed such that when an externally applied magnetic field is zero, it is perpendicular to the direction of magnetization of the second ferromagnetic layer. The fixation of the direction of magnetization of the first ferromagnetic layer is achieved by the exchange coupling of it with an antiferromagnetic layer provided adjacent to it, whereby unidirectional anisotropic energy (also called the "exchange bias" or "coupled magnetic field") is applied to the first ferromagnetic layer. For this reason, the first ferromagnetic layer is also called the fixed magnetization layer. By contrast, the second ferromagnetic layer is also called the free layer. Further, if the fixed magnetization layer (the first ferromagnetic layer) is configured as a triple-layer structure of a ferromagnetic layer/nonmagnetic metal layer/ferromagnetic layer (the so-called "multilayer ferri-structure" or "synthetic pinned layer"), it is then possible to give a strong exchange coupling between both ferromagnetic layers thereby effectively increasing the exchange coupling force from the antiferromagnetic layer, and to reduce influences on the free layer of a static magnetic field resulting from the fixed magnetization layer. Thus, the "synthetic pinned structure" is now in extensive use.

However, a further slimming-down of the magnetoresistive device is in great need so as to meet recent demands for ultra-high recording density. Such being the case, there is a novel GMR device structure put forward, which has a basic structure comprising a simple triple-layer arrangement of ferromagnetic layer (free layer)/nonmagnetic intermediate layer/ferromagnetic layer (free layer), as set forth typically in publication 1 (IEEE TRANSACTION ON MAGNETICS, VOL. 43, NO. 2, FEBRUARY, pp. 645-650 as well as U.S. Pat. No. 7,019,371B2 or U.S. Pat. No. 7,035,062B1.

For the sake of convenience, such structure is here called the dual free layer (DFL) device structure. In the DFL device structure, the two ferromagnetic layers are exchange coupled together such that their magnetizations are antiparallel with each other. And under the action of a bias magnetic field given out of a magnet located in a depth position opposite to the ABS corresponding to the surface of the device facing a medium, there is an initial state created in which the magnetizations of two magnetic layers (free layers) are inclined about 45° with respect to the track width direction. Upon detection of a signal magnetic field from the medium in the initial state of the device, the directions of magnetization of the two magnetic layers change as if scissors cut paper, with the result that there is a change in the resistance value of the device.

When such a DFL device structure is applied to the so-called TMR or CPP-GMR device, it is possible to make the gap (read gap length) between the upper and lower shield layers much narrower as compared with a conventional, ordinary spin valve type CPP-GMR device. Specifically, it is possible to make do without the aforesaid antiferromagnetic layer that is needed for the ordinary spin valve type CPP-GMR device as well as the ferromagnetic layers of the aforesaid "synthetic pinned structure". As a result, the "read gap layer" that has been said to be 30 nm at the very most can be reduced down to 20 nm or less.

A requirement for the formation of the prior art DFL device structure is that, as already noted, the two ferromagnetic layers (free layers) are exchange coupled together such that their magnetizations are mutually anti-parallel. Such a conventional basic structure is easily achievable by inserting Au, Ag, Cu, Ir, Rh, Ru, Cr or other noble metal between the two ferromagnetic layers (free layers) to generate an exchange coupling between them.

A problem with the TMR device, however, is that an insulating film such as an aluminum oxide ($AlO_x$) or magnesium oxide (MgO) film must be interposed between the two ferromagnetic layers (free layers), leading to the inability to obtain any strong exchange coupling between them. As a result, there is much difficulty in the anti-parallel coupling between the two ferromagnetic layers (free layers). Also, there is a technique known in the art (for instance, JP(A)2004-165254, JP Patent No. 3625199, JP(A)2002-208744 and so on), in which a NOL (nano-oxide-layer) is partially inserted between the two ferromagnetic layers (free layers) thereby boosting up the output of the CPP-GMR device. However, this technique cannot immediately be used because of the risk of the antiferromagnetic exchange coupling of the two ferromagnetic layers (free layers) growing very weak or vanishing off.

Further, U.S. Pat. No. 6,169,647B1 shows a technique of using two antiferromagnetic material layers to place the magnetizations of two ferromagnetic layers (free layers) in an antiparallel state (see FIG. 3 in particular). To make viable the structure according to this proposal, however, the antiferromagnetic material layers must each have a thickness of at least 5 nm that is contradictory to the purpose of curtailing the "read gap length". Another requirement is that the directions of exchange coupling generated from the two antiferromagnetic material layers be antiparallel with each other, rendering heat treatment (annealing) for achieving that very difficult. As device size gets narrow and small, it causes a decrease in the number of particles lined up to form the antiferromagnetic material layers and, hence, renders the so-called pinning action erratic (or insufficient), giving rise to inconvenience responsible for erratic performance.

The situations being like this, Applicant has already filed U.S. Ser. No. 11/946,358 for the purpose of providing a novel magnetoresistive device that makes it possible to achieve an antiparallel magnetization state for two ferromagnetic layers (free layers) with simple structure yet without being restricted by the material and specific structure of an intermediate film interposed between the two ferromagnetic layers (free layers), that makes it possible to improve on linear recording densities by the adoption of a structure capable of making the "read gap length" (the gap between the upper and lower shield layers) narrow thereby meeting recent demands for ultra-high recording densities, and that makes it possible to obtain stable magnetoresistive changes so that much higher reliability is achievable.

The invention of this application has for its object the provision of a magnetoresistive device that makes further progresses in the art of U.S. Ser. No. 11/946,358 already filed by Applicant, thereby stabilizing control of the domains of shield layers so that the outflow of a leakage magnetic field from shield layers, which may otherwise cause unwanted writing on a recording medium, is kept more in check, and improving more on the reliability of device operation.

SUMMARY OF THE INVENTION

According to the present invention, the aforesaid object is accomplished by the provision of a magnetoresistive device of the CPP (current perpendicular to plane) structure, comprising a magnetoresistive unit, and a first shield layer and a second shield layer which are located and formed such that the magnetoresistive unit is sandwiched between them from above and below, with a sense current applied in the stacking direction, wherein:

said magnetoresistive unit comprises a non-magnetic intermediate layer, and a first ferromagnetic layer and a second ferromagnetic layer stacked and formed such that said non-magnetic intermediate layer is sandwiched between them, said first shield layer and said second shield layer include a first shield parallel layer and a second shield parallel layer, respectively, between which said magnetoresistive unit is sandwiched from above and below, both ends of either one of said first shield parallel layer and said second shield parallel layer are provided with joining layers that extend from said both ends substantially toward both ends of the other shield parallel layer, a nonmagnetic insulating layer is interposed between ends of said joining layers and an end of said other shield parallel layer, and said first shield layer and said second shield layer are joined together by way of said nonmagnetic insulating layer, forming a substantially insulated, closed magnetic path, the first shield parallel layer for said first shield layer and the second shield parallel layer for said second shield layer are each controlled by magnetization direction control means in terms of magnetization direction, and said first ferromagnetic layer and said second ferromagnetic layer each receive action such that under the magnetic actions of the first shield parallel layer for said first shield layer and the second shield parallel layer for said second shield layer, there is an anti-parallel magnetization state created with their mutual magnetizations being in the opposite directions.

In a preferable embodiment of the magnetoresistive device of the invention, said first ferromagnetic layer is magnetically coupled to the first shield parallel layer for said first shield layer having a controlled magnetization direction indirectly by way of a first exchange coupling function gap layer, and said second ferromagnetic layer is magnetically coupled to the second shield parallel layer for said second shield layer having a controlled magnetization direction indirectly by way of a second exchange coupling function gap layer.

In a preferable embodiment of the magnetoresistive device of the invention, said first exchange coupling function gap layer comprises, in order from the first shield parallel layer side of said first shield layer, an exchange coupling transfer layer, a gap adjustment layer and an exchange coupling adjustment layer, and said second exchange coupling function gap layer comprises, in order from the second shield parallel layer side of said second shield layer side, an exchange coupling transfer layer, a gap adjustment layer and an exchange coupling adjustment layer.

In a preferable embodiment of the magnetoresistive device of the invention, said exchange coupling transfer layer is made of at least one material selected from the group consisting of Ru, Rh, Ir, Cr, Cu, Ag, Au, Pt, and Pd; said gap adjustment layer is made up of a ferromagnetic material; and said exchange coupling adjustment layer is made of at least one material selected from the group consisting of Ru, Rh, Ir, Cr, Cu, Ag, Au, Pt, and Pd.

In a preferable embodiment of the magnetoresistive device of the invention, the magnetization direction control means for controlling the magnetization direction of each of the first shield parallel layer for said first shield layer and the second shield parallel layer for said second shield layer is by a shape anisotropy function of said first shield layer and said second shield layer, or an exchange coupling function from an antiferromagnetic material.

In a preferable embodiment of the magnetoresistive device of the invention, said first shield layer, and said second shield layer is allowed by said magnetization direction control means to have a single domain structure.

In a preferable embodiment of the magnetoresistive device of the invention, said first exchange coupling function gap layer comprises, in order from the first shield parallel layer side of said first shield layer, an exchange coupling transfer layer, a gap adjustment layer, an exchange coupling transfer layer, a gap adjustment layer, and an exchange coupling adjustment layer, and said second exchange coupling function gap layer comprises, in order from the second shield parallel layer side of said second shield layer, an exchange coupling transfer layer, a gap adjustment layer, an exchange coupling transfer layer, a gap adjustment layer, and an exchange coupling adjustment layer.

In a preferable embodiment of the magnetoresistive device of the invention, said nonmagnetic intermediate layer is made up of a triple-layer structure film with ZnO located at the center thereof.

In a preferable embodiment of the magnetoresistive device of the invention, the width (W2) of said second shield parallel layer that is located above is larger than the width (W1) of said first shield parallel layer that is located below; both ends of said second shield parallel layer are provided with joining layers that extend from said both ends substantially toward both ends of said first shield parallel layer; said joining layers comprise side sheet layers suspending from both ends of said second shield parallel layer, and a lower connecting layer formed along said side sheet layers; said lower connecting layer is positioned flush with said first shield parallel layer that is located below, and extends toward both ends of said first shield parallel layer in a width direction; and the front surface of said lower connecting layer is positioned deeper (rearward) than the front surface of said first shield parallel layer.

In a preferable embodiment of the magnetoresistive device of the invention, a nonmagnetic insulating layer is interposed between said lower connecting layer and said first shield parallel layer.

In a preferable embodiment of the magnetoresistive device of the invention, the front surface of said first shield parallel layer constitutes an ABS (air bearing surface).

In a preferable embodiment of the magnetoresistive device of the invention, the front surface of said lower connecting layer is positioned about 50 nm to 1 μm deeper (rearward) than the front surface of said first shield parallel layer.

In a preferable embodiment of the magnetoresistive device of the invention, corners of said first shield parallel layer located below, which lie in the width direction and on the ABS (air bearing surface) side, are cut off along the thickness direction.

In a preferable embodiment of the magnetoresistive device of the invention, the width (W2) of said second shield parallel layer positioned above is equal to the width (W1) of said first shield parallel layer positioned below; both ends of said second shield parallel layer are provided with joining layers that extend from said both ends substantially toward both ends of said first shield parallel layer; and said joining layers are side sheet layers suspending down from both ends of said second shield parallel layer.

In a preferable embodiment of the magnetoresistive device of the invention, the front surface of said first shield parallel layer located below has its front center area positioned in front of both its side areas, and said front center area constitutes an ABS (air bearing surface).

In a preferable embodiment of the magnetoresistive device of the invention, a nonmagnetic insulating layer is interposed between the lower ends of said side sheet layers and said first shield parallel layers.

The invention also provides a thin-film magnetic head, comprising a plane in opposition to a recording medium, and the aforesaid magnetoresistive that is located near said medium opposite plane to detect a signal magnetic field from said recording medium.

Further, the invention provides a head gimbal assembly, comprising a slider including the aforesaid thin-film magnetic head and located in such a way as to oppose to a recording medium, and a suspension adapted to resiliently support said slider.

Yet Further, the invention provides a magnetic disk system, comprising a slider including the aforesaid thin-film magnetic head and located in such a way as to oppose to a recording medium, and a positioning device adapted to support and position said slider with respect to said recording medium.

BRIEF EXPLANATION OF THE DRAWINGS

FIG. 4 is a perspective view of only the first and the second shield layer extracted or taken out of the whole device construction.

FIGS. 5-7 are illustrative in perspective of one exemplary process of forming in order the first and the second shield layer shown in FIG. 1.

FIG. 18 is illustrative in perspective, as in FIG. 1, of a modification to FIG. 1.

FIG. 19 is illustrative of the structure of the lower portion of the magnetoresistive device of FIG. 18: FIG. 19 is an A1-A1 sectional view of FIG. 18 (a view of a section cut on an X-Y plane as viewed from above or in the Z-direction).

FIG. 20 is illustrative, as in FIG. 19, of a more preferable modification.

EXPLANATION OF THE PREFERRED EMBODIMENTS

Figure 1:
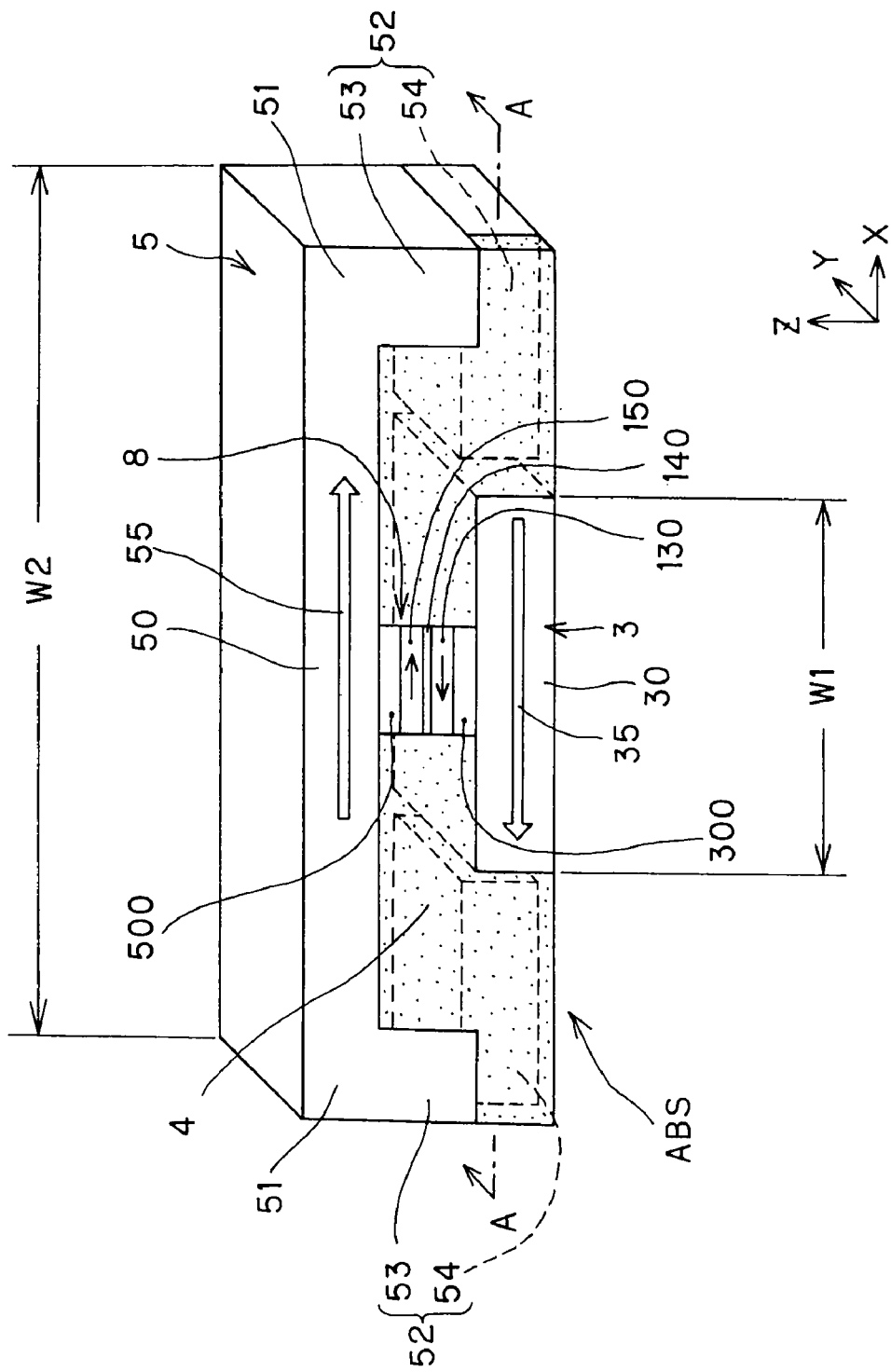
FIG. 1 is illustrative in perspective of the magnetoresistive device according to an embodiment of the invention, as viewed from the ABS (air bearing surface).

The best mode for carrying out the invention is now explained in greater details.

The magnetoresistive device of the invention is preferably used with a thin-film magnetic head in general and a reproducing head in particular.

In the following disclosure of the invention, the sizes of each device component in the X-, Y- and Z-axis directions shown in the drawings will be referred to as the "width", "length" and "thickness", respectively. The side of the device nearer to the air bearing surface (the plane of the thin-film magnetic head in opposition to the recording medium) in the Y-axis direction will be called "forward" and the opposite side (depth side) will be called "rearward", and the direction of stacking the individual films up will be called "upward" or "upper side" and the opposite direction will be called "downward" or "lower side".

FIG. 1 is illustrative in perspective of the magnetoresistive device according to an embodiment of the invention, as viewed from the ABS (air bearing surface). The ABS is generally corresponding to a plane (hereinafter often called the medium opposite plane) at which the device lies in opposition to the recording medium; however, it is understood that the ABS here includes even a section at a position where the multilayer structure of the device can be clearly observed. For instance, a protective layer of DLC (the protective layer adapted to cover the device) or the like, in a strict sense, positioned facing the medium opposite plane may be factored out, if necessary.

Figure 2:
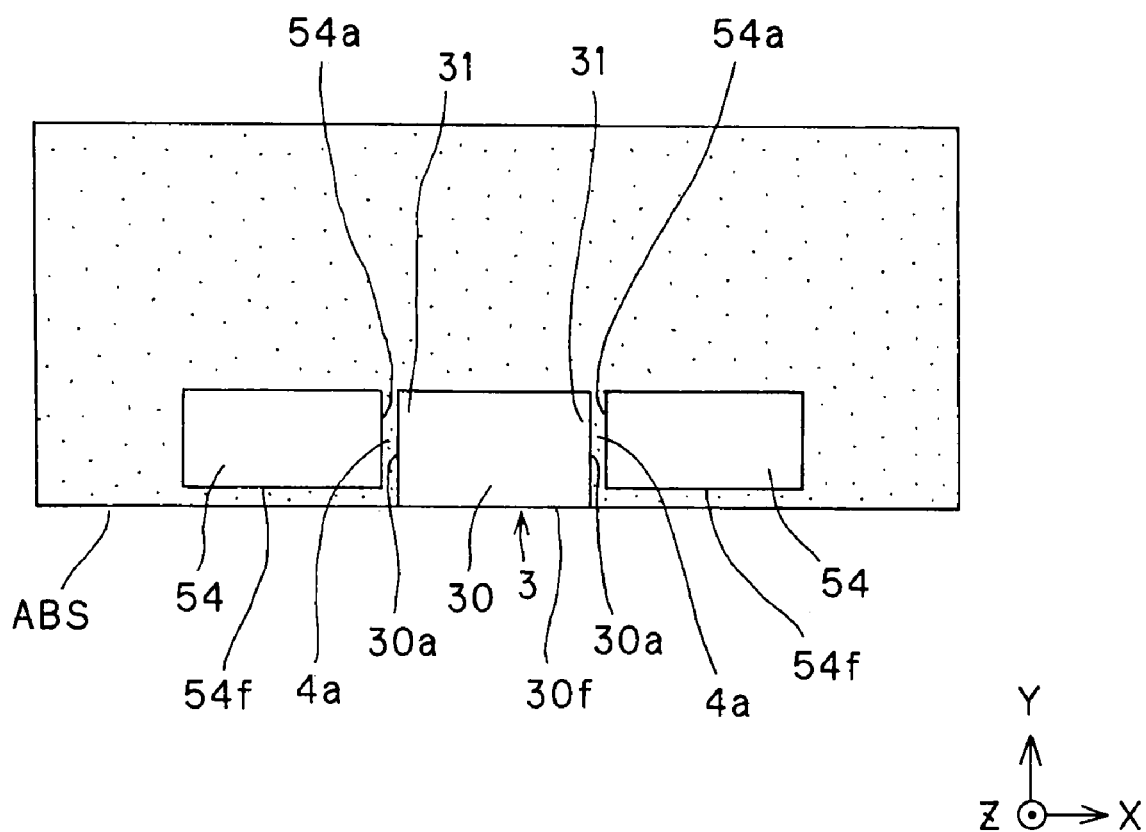
FIG. 2 is a sectional view of FIG. 1 as taken on an A-A section (FIG. 2 is a view of a section cut on an X-Y plane, as viewed from above or in the Z-direction).

FIG. 2 is illustrative of the structure of the magnetoresistive device of FIG. 1 near the lower shield located below: it is a sectional view of FIG. 1 as taken on an A-A section (viz., a view of a section cut on an X-Y plane including the lower shield).

Figure 3:
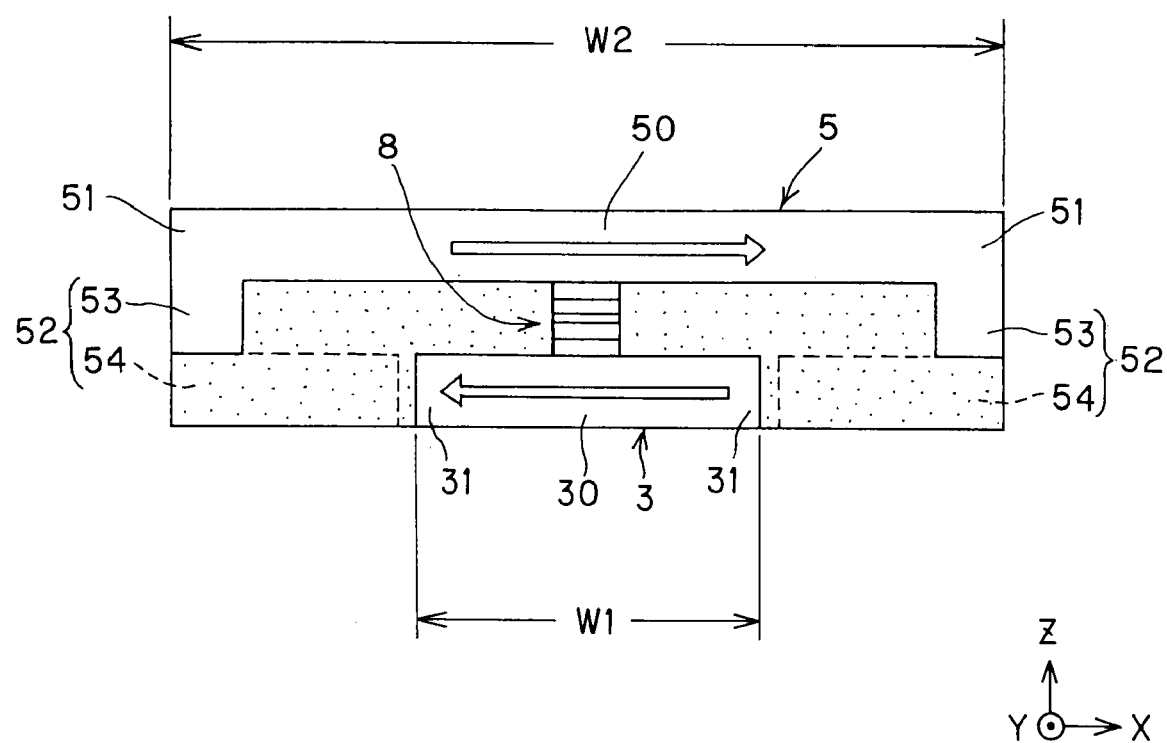
FIG. 3 is a front view of the magnetoresistive device of FIG. 1, and is illustrative of the ABS.

FIG. 3 is a front view of the magnetoresistive device of FIG. 1, and is illustrative of the ABS.

FIG. 4 is a perspective view of only the first and the second shield layer extracted or taken out of the device.

Figure 6:
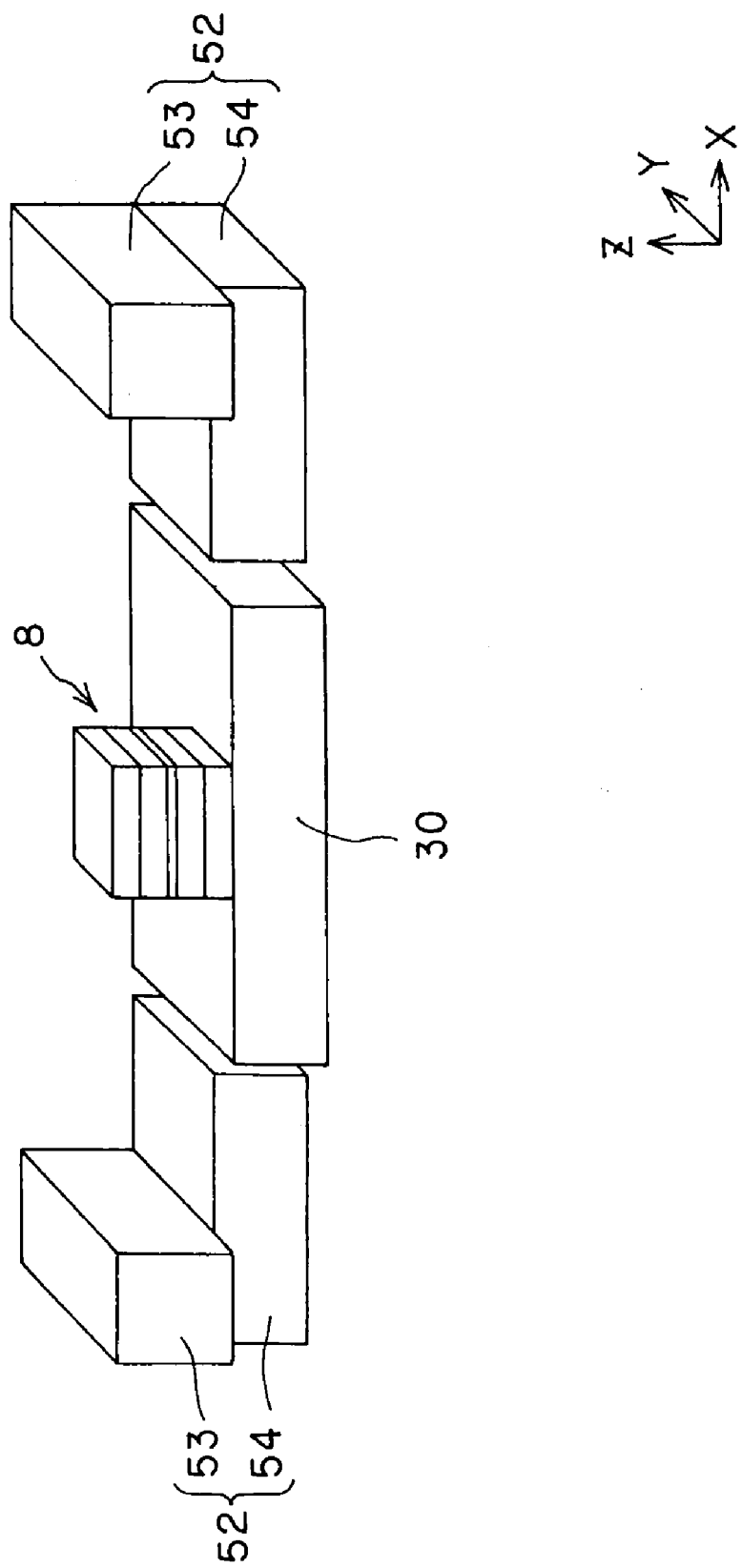
Figure 7:
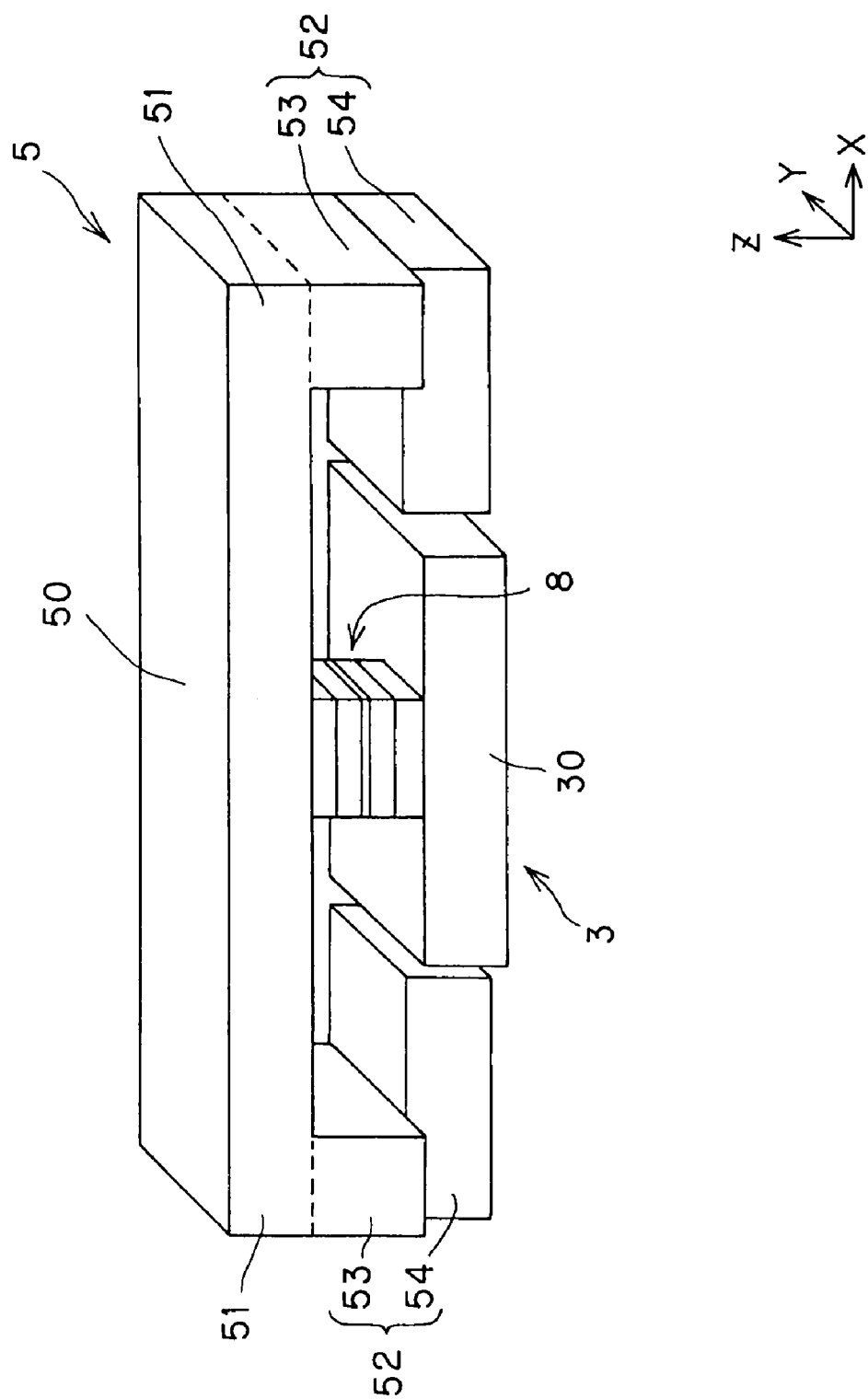

FIGS. 5-7 are illustrative in perspective of one exemplary process of forming in order the first and the second shield layer shown in FIG. 1.

Figure 8:
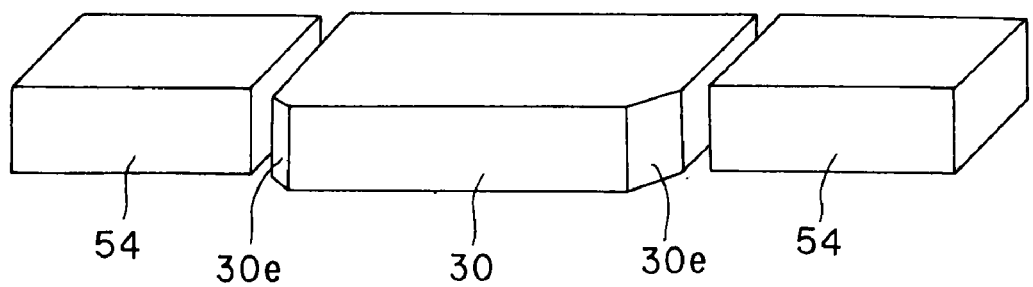
FIG. 8 is illustrative of, as in FIG. 5, of a more preferable modification.

FIG. 8 is illustrative of, as in FIG. 5, of a more preferable modification.

Figure 9:
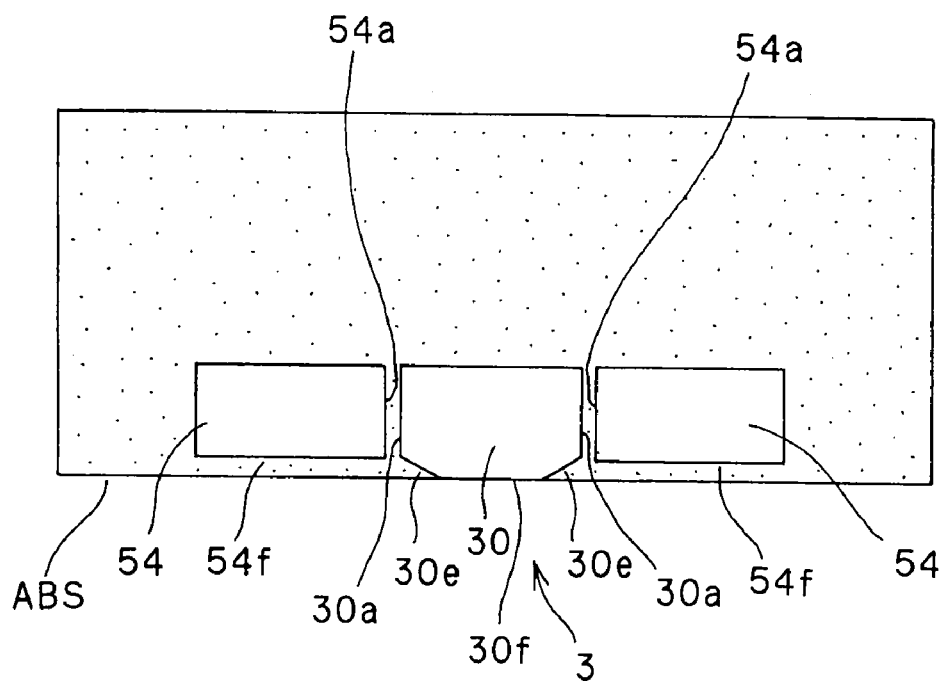
FIG. 9 is illustrative of, as in FIG. 2, of a more preferable modification.

FIG. 9 is illustrative of, as in FIG. 2, of a more preferable modification.

Figure 10:
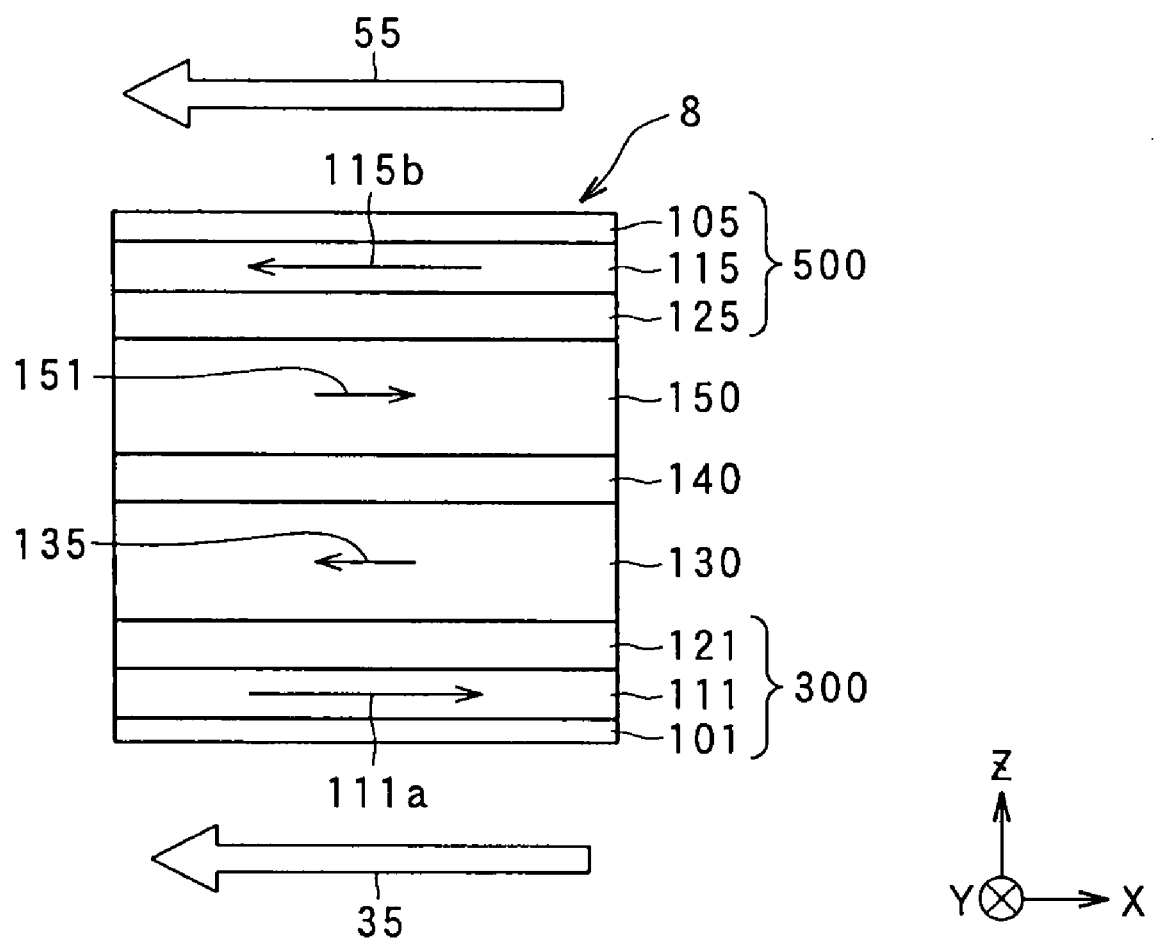
FIG. 10 is an enlarged schematic view of the magnetoresistive unit in the magnetoresistive device of FIG. 1 including a sensor area.

FIG. 10 is an enlarged schematic view of the magnetoresistive unit in the magnetoresistive device of FIG. 1 including a sensor area.

[Explanation of the Structure of the Magnetoresistive Device]

As shown in FIG. 1, the magnetoresistive device of the invention comprises a magnetoresistive unit 8, and a first shield layer 3 (also called the lower shield layer 3) and a second shield layer 5 (also called the upper shield layer 5) wherein those shield layers are located and formed such that the magnetoresistive unit 8 is substantially sandwiched between them from above and below. And the magnetoresistive device of the invention is a magnetoresistive device of the CPP (current perpendicular to plane) structure with a sense current applied in the stacking direction of the magnetoresistive unit 8.

Explanation of the First Embodiment

The first embodiment of the inventive magnetoresistive device is now explained with reference to FIGS. 1 to 7. The first 3, and the second shield layer 5 is controlled by magnetization direction control means in terms of the direction of magnetization. In addition, the first 3 and second shield layer 5 combination used here has a special configuration with a view to stabilizing domain control of the shield layers, thereby keeping more in check an outflow of leakage magnetic field likely to cause unwanted writing on a recording medium.

First of all, reference is made to the configuration of the first 3, and the second shield layer 5.

The configuration of the first 3, and the second shield layer 5 will be more easily understood by reference to FIGS. 1, 2 and 3 plus FIG. 4 illustrative of only these members 3 and 5.

That is, as shown in FIG. 1 or 4, the first 3 and the second shield layer 5 of the magnetoresistive device according to the first embodiment comprises a first 30 and a second shield parallel layer 50 wherein a magnetoresistive unit 8 located at substantially the center is sandwiched from above and below. In the embodiment here, the first shield layer 3 is formed of the first shield parallel layer 30. In other words, the first shield layer according to the embodiment here is synonymous with the first shield parallel layer 30.

In such first embodiment, the width (W2) of the second shield parallel layer 50 that is located above is larger than the width (W1) of the first shield parallel layer 30 that is located below. And, as shown in FIG. 4, each of both ends 51 of the second shield parallel layer 50 is provided with a joining layer 52 that extends substantially toward each of both ends 31 of the first shield parallel layer 30. The phrase "extending substantially toward" here is intended to include all cases, for instance, cases where it extends toward the end 31 by way of a linear passage, a curved passage, and a bent passage.

As can clearly be seen from FIG. 4, the joining layer 52 comprises, and is built up of, a side sheet layer 53 extending along and down from each of both ends 51 of the second shield parallel layer 50 and a lower connecting layer 54 extending along that side sheet layer 53 in the width (X) direction.

As shown in FIG. 1 or 3, the lower connecting layer 54 is positioned flush with the first shield parallel layer 30 that is located below, extending toward each of both ends of 31 of the first shield parallel layer 30 in the width (X) direction.

As shown in FIG. 2, there is a nonmagnetic insulating layer 4a interposed between the end face 54a of the lower connecting layer 54 and the end face 30a of the first shield parallel layer 30. Due to the interposition of the nonmagnetic insulating layer 4a the first 3 and the second shield layer 5 are joined to each other such that there is a substantially insulated, closed magnetic path formed. The phrase "substantially insulated, closed magnetic path" here is intended to refer to a state where at a site where the first 3 is in proximity to the second shield layer 5 (in the embodiment here, a site where the end face 54a of the lower connecting layer 54 is in proximity to the end face 30a of the first shield layer 30), insulation is maintained due to the presence of the nonmagnetic intermediate layer 4a to let the first 3 and the second shield layer 5 function as electrodes, and where at a site where the first 3 is in proximity to the second shield layer 5 (in the embodiment here, a site where the end face 54a of the lower connecting layer 54 is in proximity to the end face 30a of the first shield parallel layer 30) the magnetic path remains uninterrupted due to the presence of the nonmagnetic insulating layer 4a.

The nonmagnetic insulating layer 4a has a thickness of about 10 nm to 1 μm, and that thickness is especially set such that the aforesaid insulation function and uninterrupted magnetic path are sufficiently ensured. Especially to allow the uninterrupted magnetic path to perform better, it is preferable that the surfaces 54a and 30a that generate magnetic charges are in opposition to each other.

Further in this embodiment, it is desired that the front surface 54f of the lower connecting layer 54 be positioned deeper than the front surface 30f of the first shield parallel layer 30 (rearward: Y-direction). In this case, the front surface 30f of the first shield parallel layer 30 is going to form the ABS (air bearing surface), and the front surface 54f of the lower connecting layer 54 is desirously positioned in such a way as to be about 50 nm to 1 μm deep (rearward) from the front surface 30f of the first shield parallel layer 30. As this value grows too small, it causes the first shield parallel layer 30 to be likely to join to the lower connecting layer 54, giving rise to short circuits in the event that the ABS is finally polished to form an MR height. As this value grows too large, on the other hand, there is an insufficiently uninterrupted magnetic path, likely giving rise to unwanted leakage magnetic fields.

It is noted that as shown in FIGS. 1 to 3, gap portions occurring after the first shield layer 3, second shield layer 5 and magnetoresistive unit 8 are combined in such a way as to be positioned in given relations are usually filled up with a nonmagnetic insulating material 4.

Then, one exemplary process of sequentially forming the aforesaid first and second shield layers is explained with reference to FIGS. 5 to 7.

As shown typically in FIG. 5, the first shield parallel layer 30 and the lower connecting layers 54 that form a part of the second shield layer are formed on a nonmagnetic substrate at given positions. That is, in consideration of the polishing of the medium opposite plane for the formation of the MR height, the front surface of the first shield parallel layer 30 is positioned in front of the front surface position of the lower connecting layers 54.

Then, as shown in FIG. 6, the magnetoresistive unit 8 of the TMR or CPP-GMR type in film form is formed on the first shield parallel layer 30. Thereafter, a soft magnetic film such as a NiFe film is formed on the lower connecting layers 54, and patterned into the desired shape to form the side sheet layers 53. Note here that near the rear end of the magnetoresistive unit 8 (the Y-direction: the direction of the paper coming in the paper), a hard magnetic layer (hard magnet layer) such as a CoPt layer for the application of bias magnetic fields may be provided almost flush with the magnetoresistive unit 8.

Then, after the configuration shown in FIG. 6 is completed, the whole is provided with an insulating film, after which chemical mechanical polishing or like method is applied for flattening. By this flattening, the head surfaces of the magnetoresistive unit 8 and side sheet layers 53 are exposed, and the second shield parallel layer 50 is formed on a flat surface including such head surfaces to form the magnetoresistive device, as shown in FIG. 7.

What relations the first and second shield layers 3 and 5 have to the magnetoresistive unit 8 in the inventive magnetoresistive device is now explained.

The aforesaid first and second shield layers 3 and 5 have their directions of magnetization controlled by magnetization direction control means; in the embodiment shown in FIG. 1, the first shield parallel layer 30 that is the first shield layer 3 has its magnetization fixed in the minus width direction (−X direction) from the right to the left of the paper. On the other hand, the second shield parallel layer 50 that is the second shield layer 5 has its magnetization fixed in the plus width direction (+X direction) from the left to the right of the paper.

The magnetoresistive unit 8 comprises a non-magnetic intermediate layer 140, and a first ferromagnetic layer 130 and a second ferromagnetic layer 150 stacked and formed such that the nonmagnetic intermediate layer 140 is sandwiched between them. A sensor area is defined by a multilayer structure comprising the first ferromagnetic layer 130, nonmagnetic intermediate layer 140 and second ferromagnetic layer 150, and that multilayer structure has a total thickness of about 10 to 20 nm.

Of these, the first 130 and the second ferromagnetic layer 150 function as the so-called free layers with their magnetization directions changing in response to an external magnetic field.

In the invention, the aforesaid first and second ferromagnetic layers 130 and 150 each receive action such that under the influences of magnetic actions of the first shield parallel layer 30 that is the first shield layer 3 and the second shield parallel layer 50 that is the second shield layer 5, there is an antiparallel magnetization state created in which their magnetizations are in the opposite directions. Why the phrase "action such that there is an antiparallel magnetization state created" is used here is to factor in the fact that in an actually used device, the directions of magnetization of the first and second ferromagnetic layers intersect substantially orthogonally by the application of bias magnetic fields, although not shown. In this regard, see the explanation of the initial state of FIG. 17A that will be referred to later.

To let the invention take effect, a first exchange coupling function gap layer 300 is interposed between the first shield parallel layer 30 that is the first shield layer 3 and the first ferromagnetic layer 130, and a second exchange coupling function gap layer 500 is interposed between the second shield parallel layer 50 that is the second shield layer 5 and the ferromagnetic layer 150. In other words, the first ferromagnetic layer 130 is magnetically coupled to the first shield parallel layer 30 that is the first shield layer 3 having its direction of magnetization controlled indirectly by way of the first exchange coupling function gap layer 300, and the second ferromagnetic layer 150 is magnetically coupled to the second shield parallel layer 50 that is the second shield layer 5 having its direction of magnetization controlled indirectly by way of the second exchange coupling function gap layer 500.

Each of these components of the invention is now explained at great length.

(Explanation of the Function of the First 3, and the Second Shield Layer 5)

In the invention, the first 3 and the second shield layer 5 each have such configuration as described above, and both the members are joined to each other in such a way as to form the substantially insulated, closed magnetic path.

And the first and second shield layers 3 and 5 have:

(1) a function of shielding off magnetism from an external magnetic field, (2) an electrode function, and (3) a function of giving magnetic action to the first 130 and the second ferromagnetic layer 150 such that there is an antiparallel magnetization state created in which their magnetizations are in the opposite directions.

The aforesaid functions (1) and (2) have already been known in the art.

To let the aforesaid function (3) take effect, the first shield parallel layer 30 that is the first shield layer, and the second shield parallel layer 50 that is the second shield layer 5 has its direction of magnetization controlled by magnetization direction control means, as already mentioned.

In the embodiment shown in FIG. 1, the first shield parallel layer 30 that is the first shield layer 3 has its magnetization fixed in the minus width direction (–X direction) from the right to the left of the paper. On the other hand, the second shield parallel layer 50 that is the second shield layer 5 has its magnetization fixed in the plus width direction (+X direction) from the left to the right of the paper.

In other words, the first 3, and the second shield layer 5 is constructed in such a way as to have a single domain structure by way of the magnetization direction control means. It is here noted that the first shield parallel layer 30 that is the first shield layer 3 and the second shield parallel layer 50 that is the second shield layer 5 may have magnetization directions opposite to those shown.

The magnetization direction control means, for instance, involves (1) a method that relies upon shape anisotropy resulting from the given shape and size of the first, and the second shield layer, or (2) a method wherein an antiferromagnetic material is joined to or combined with the first, and the second shield layer to fix their magnetizations by that antiferromagnetic material. To put it another way, the first 3, and the second shield layer 5 is allowed to have a single domain by way of the so-called anisotropy, or exchange coupling from the antiferromagnetic material.

For the magnetization direction control means, particular preference is given to the aforesaid method (1) wherein the single domain is created using shape anisotropy. And, as shown in FIG. 1, the magnetization directions 35 and 55 of the first and second shield parallel layers 30 and 50 that are the first and second shield layers are set in such a way as to be antiparallel with each other.

To make use of shape anisotropy to let the first and second shield layers 3 and 5 have a single domain, their width in the longitudinal (X) direction is typically about 30 μm, and their depth (Y-direction) length is typically about 3 μm.

To let them have a single domain, it is desired that the aspect ratio (X/Y ratio) be at least 10.

The first 3, and the second shield layer 5, for instance, may be made of NiFe (permalloy), CoZrTa, sendust, NiFeCo, and CoZrNb.

Each layer may have a thickness (Z-direction) of typically about 20 nm to 3 μm.

(Explanation of the Magnetoresistive Unit 8)

As shown in FIG. 1, there is the magnetoresistive unit 8 interposed between the first shield parallel layer 30 that is the first shield layer 3 and the second shield parallel layer 50 that is the second shield layer 5. And on each side of the magnetoresistive unit 8 there is a nonmagnetic layer 4 made of alumina ($Al_2O_3$) or the like located to define a reading track width.

As shown in FIG. 1, the magnetoresistive unit 8 comprises a sensor area positioned at substantially the center of the multilayer film and comprising the first ferromagnetic layer 130, nonmagnetic intermediate layer 140 and second ferromagnetic layer 150, and the first 300 and the second exchange coupling function gap layer 500 that are interposed between that sensor area, and the first shield layer 3 and the second shield layer 5, respectively.

Between the sensor area and the first shield parallel layer 30 that is the first shield layer 3, and between the sensor area and the second shield parallel layer 50 that is the second shield layer 5, there is a given gap needed corresponding to the recording density. This is to make sure the capturing in the sensor area of only the external magnetic field as signals. As the gap grows larger than necessary, there is a risk of capturing not only the signal magnetic field but also adjacent other signal magnetic fields. Conversely, as the gap is way too shorter or smaller than the necessary distance, there is a risk of the signal magnetic field being drawn in the shield layers 3 and 5 surrounding the sensor area rather than in the sensor area.

It goes without saying that the first 300 and the second exchange coupling function gap layer 500 must have such a gap function. Added to this in the invention, the first 300 and the second exchange coupling function gap layer 500 must be made up of such a multilayer structure as explained below for the purpose of letting the key function (characteristic function) of the invention show up. Note here that the detailed structure of the first 300, and the second exchange coupling function gap layer 500 is shown in FIG. 10, as described just below.

Explanation of the First Exchange Coupling Function Gap Layer 300

As shown in FIG. 10, the first exchange coupling function gap layer 300 comprises, and is made up of, in order from the side of the first shield parallel layer 30 for the first shield layer 3, an exchange coupling transfer layer 101, a gap adjustment layer 111 and an exchange coupling adjustment layer 121. The gap adjustment layer 111 is a so-called ferromagnetic layer made of a ferromagnetic material.

The exchange coupling transfer layer 101 is made of at least one material selected from the group consisting of Ru, Rh, Ir, Cr, Cu, Ag, Au, Pt and Pd: it is capable of adjusting the strength of magnetic coupling of the magnetization 35 of the first shield parallel layer 30 for the first shield layer 3 to the magnetization 111a of the gap adjustment layer 111 depending on what material is selected and what thickness it is set at. As the material to be used is determined and its thickness is set, the direction of the magnetization 111a of the gap adjustment layer 111 magnetically coupled to the magnetization 35 of the first shield parallel layer 30 for the first shield layer 3 is also determined. To put it another way, whether there is antiferromagnetic coupling where the magnetizations are magnetically coupled together in the opposite directions or ferromagnetic coupling where the magnetizations are magnetically coupled together in the same direction is determined.

The exchange coupling adjustment layer 121 is made of at least one material selected from the group consisting of Ru, Rh, Ir, Cr, Cu, Ag, Au, Pt and Pd: it is capable of adjusting the strength of magnetic coupling of the magnetization 111a of the gap adjustment layer 111 to the magnetization 135 of the first ferromagnetic layer 130 depending on what material is selected and what thickness it is set at. As the material to be used is determined and its thickness is set, the direction of the magnetization 135 of the first ferromagnetic layer 130 magnetically coupled to the magnetization 111a of the gap adjustment layer 111 is also determined. To put it another way, whether there is antiferromagnetic coupling or ferromagnetic coupling is determined.

The requirement for the invention is that the first ferromagnetic layer 130 functions as the so-called free layer that responds to the external magnetic field with high sensitivity. To this end, the first ferromagnetic layer 130 is set such that the strength of magnetic coupling of the magnetization 35 of the first shield parallel layer 30 for the first shield layer 3 to the magnetization 111a of the gap adjustment layer 111 grows strong, and the strength of the magnetization 111a of the gap adjustment layer 111 to the magnetization 135 of the first ferromagnetic layer 130 gets relatively weak.

The first exchange coupling function gap 300 has a thickness set at about 1.5 to 6.0 nm.

Explanation of the Second Exchange Coupling Function Gap Layer 500

As shown in FIG. 10, the second exchange coupling function gap layer 500 comprises, and is made up of, in order from the side of the second shield parallel layer 50 for the second shield layer 5, an exchange coupling transfer layer 105, a gap adjustment layer 115 and an exchange coupling adjustment layer 125. The gap adjustment layer 115 is a so-called ferromagnetic layer made of a ferromagnetic material.

The exchange coupling transfer layer 105 is made up of at least one material selected from the group consisting of Ru, Rh, Ir, Cr, Cu, Ag, Au, Pt and Pd: it is capable of adjusting the strength of magnetic coupling of the magnetization 55 of the second shield parallel layer 50 for the second shield layer 5 to the magnetization 115b of the gap adjustment layer 115 depending on what material is selected and what thickness it is set at. As the material to be used is determined and its thickness is set, the direction of the magnetization 115b of the gap adjustment layer 115 magnetically coupled to the magnetization 55 of the second shield parallel layer 50 for the second shield layer 5 is also determined. To put it another way, whether there is antiferromagnetic coupling (where the magnetizations are magnetically coupled together in the opposite directions) or ferromagnetic coupling (where the magnetizations are magnetically coupled together in the same direction) is determined.

The exchange coupling adjustment layer 125 is made of at least one material selected from the group consisting of Ru, Rh, Ir, Cr, Cu, Ag, Au, Pt and Pd: it is capable of adjusting the strength of magnetic coupling of the magnetization 115b of the gap adjustment layer 115 to the magnetization 151 of the second ferromagnetic layer 150 depending on what material is selected and what thickness it is set at. As the material to be used is determined and its thickness is set, the direction of the magnetization 151 of the second ferromagnetic layer 150 magnetically coupled to the magnetization 115b of the gap adjustment layer 115 is also determined. To put it another way, whether there is antiferromagnetic coupling or ferromagnetic coupling is determined.

The requirement for the invention is that the second ferromagnetic layer 150 functions as the so-called free layer that responds to the external magnetic field with high sensitivity. To this end, the second ferromagnetic layer 150 is set such that the strength of magnetic coupling of the magnetization 55 of the second shield parallel layer 50 for the second shield layer 5 to the magnetization 115b of the gap adjustment layer 115 grows strong, and the strength of the magnetization 115b of the gap adjustment layer 115 to the magnetization 151 of the second ferromagnetic layer 150 gets relatively weak.

The second exchange coupling function gap 500 has a thickness set at about 1.5 to 6.0 nm.

Explanation of the Adjustment of the Strength of Magnetic Coupling (the Strength of the Exchange Coupled Magnetic Field)

The adjustment of the strength of magnetic coupling (the strength of the exchange coupled magnetic field) is now explained with reference to FIGS. 14 and 15.

Figure 14:
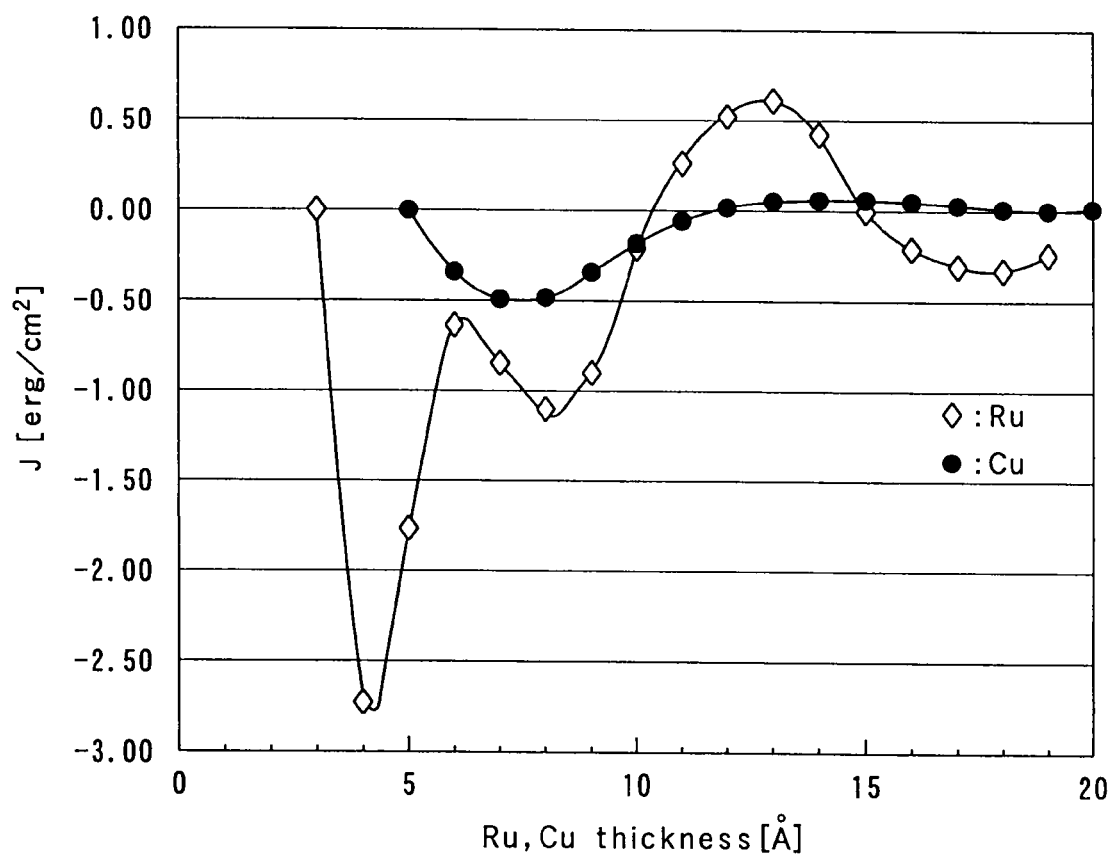
FIG. 14 is a graph indicative of the thickness t (Å) of Ru and Cu vs. the exchange coupled magnetic field strength J (erg/cm$^2$) in the event that Ru and Cu are used as the materials to form the exchange coupling transfer layer and the exchange coupling adjustment layer.

FIG. 14 is a graph indicative of the thickness t (Å) of Ru, and Cu vs. the exchange coupled magnetic field strength J (erg/cm$^2$) in the event that Ru, and Cu is used for the material forming the exchange coupling transfer layer 101, 105 and the exchange coupling adjustment layer 121, 125. This graph has been prepared using a $Co_{90}Fe_{10}$ alloy for the magnetic material subjected to exchange coupling with Ru or Cu held in place. FIG. 15 is a graph indicative of the Cu thickness t (Å) vs. the exchange coupled magnetic field strength J (erg/cm$^2$): it is basically and substantially the same as the graph of FIG. 14 concerning Cu. In particular, however, the scale span for the exchange coupled magnetic field strength J (erg/cm$^2$) indicated on ordinate is enlarged for an easy understanding of fluctuations on ordinate.

Figure 15:
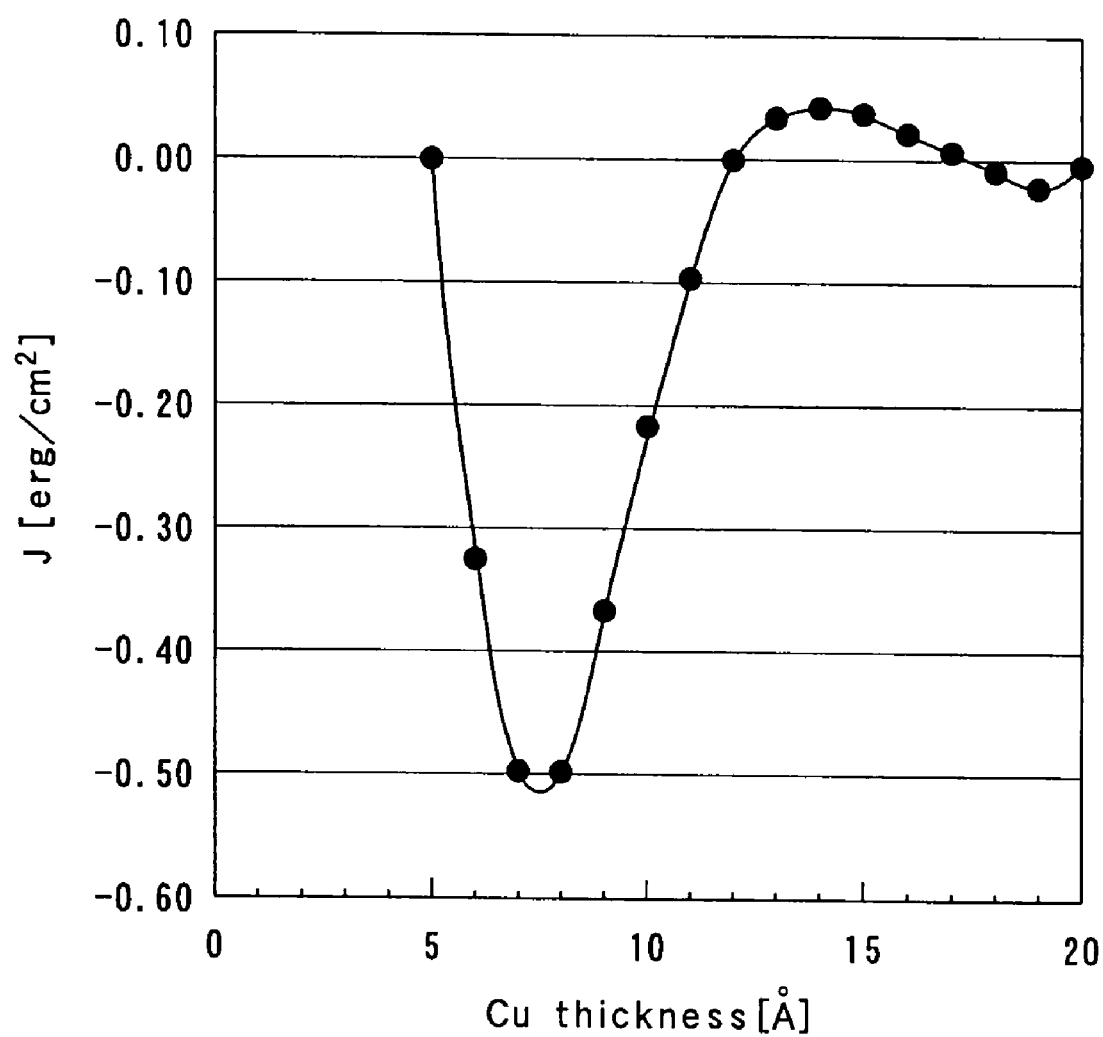
FIG. 15 is a graph indicative of the thickness t of Cu (Å) vs. the exchange coupled magnetic field J (erg/cm$^2$).

In the graphs of FIGS. 14 and 15, when the value of the exchange coupled magnetic field strength J (erg/cm$^2$) is plus (+), there is the so-called ferromagnetic coupling taking place (where magnetic coupling occurs with magnetizations in the same direction). In contrast, when the value of the exchange coupled magnetic field strength J (erg/cm$^2$) is minus (−), there is the antiferromagnetic coupling taking place (where magnetic coupling occurs with magnetizations in the same direction).

The absolute value |J| of the exchange coupled magnetic filed strength J (erg/cm$^2$) is indicative of the absolute quantity of the coupled strength itself.

Preferably, the exchange coupling transfer layer 101, 105 should be designed such that the absolute value |J| of the exchange coupled magnetic field strength J (erg/cm$^2$) is greater than 0.2 (erg/cm$^2$): |J|>0.2 (erg/cm$^2$). As the absolute value |J| of the exchange coupled magnetic field strength J (erg/cm$^2$) is below 0.2 (erg/cm$^2$), it causes the magnetizations 111a and 115b of the gap adjustment layers 111 and 115 to fluctuate under the influences of a magnetic field from the medium, resulting in inconvenience that they may otherwise function as shields.

With these considerations in mind, it is herein desired that (1) when Cu is used for the exchange coupling transfer layer 101, 105, the thickness of Cu be set in the range of 6 to 10 Å, and (2) when Ru is used for the exchange coupling transfer layer 101, 105, the thickness of Ru be set in the ranges of 4 to 9 Å and 16 to 20 Å, as can be seen from the FIGS. 14-15 graphs.

In contrast, the exchange coupling adjustment layer 121, 125 is preferably designed such that the absolute value |J| of the exchange coupled magnetic field strength J (erg/cm$^2$) is greater than 0.02 (erg/cm$^2$) but less than 0.6 (erg/cm$^2$): 0.02<|J|<0.6 (erg/cm$^2$). As the absolute value |J| of the exchange coupled magnetic field strength J (erg/cm$^2$) is below 0.02 (erg/cm$^2$), it causes the magnetization state of the first and second ferromagnetic layers 130 and 150 functioning as the free layers to come to have a multiple domain structure, resulting in inconvenience of giving rise to Barkhausen noises. As the absolute value |J| of the exchange coupled magnetic field strength J (erg/cm$^2$) is greater than 0.6 (erg/cm$^2$), it causes the magnetizations of the first and second ferro-magnetic layers 130 and 150 functioning as the free layers to be incapable of freely responding to a signal magnetic field from the medium, resulting in inconvenience that may otherwise lead to sensitivity drops.

With these considerations in mind, it is herein desired that (1) when Cu is used for the exchange coupling adjustment layer 121, 125, the thickness of Cu be set in the range of 13 to 16 Å, and (2) when Ru is used for the exchange coupling adjustment layer 121, 125, the thickness of Ru be set in the range of 9.5 to 20 Å, as can be seen from the FIGS. 14-15 graphs.

It is noted that even when Rh, Ir, Cr, Ag, Au, Pt, and Pd is used as the material to form the exchange coupling transfer layer 101, 105 and the exchange coupling adjustment layer 121, 125, the thickness of one each may be set as is the case with Ru, and Cu.

Explanation of the Sensor Area Comprising the First Ferro-Magnetic Layer 130, Nonmagnetic Intermediate Layer 140, and Second Ferromagnetic Layer 150

As already referred to, the sensor area is defined by the multilayer structure comprising the first ferro-magnetic layer 130, the nonmagnetic intermediate layer 140 and the second ferromagnetic layer 150, and the total thickness of that multilayer structure is about 10 to 20 nm. Of these layers, the first 130 and the second ferromagnetic layer 150 function as the free layers, one each having the direction of magnetization changing under the influences of an externally applied magnetic field.

For instance, the first 130, and the second ferromagnetic layer 150 is made of a material such as NiFe, CoFe, CoFeB, CoFeNi, $Co_2MnSi$, $Co_2MnGe$, and $FeO_x$ (the oxide of Fe), and has a thickness of about 0.5 to 8 nm.

The nonmagnetic intermediate layer 140 is the film essentially required to let the MR effect show up, and is typically made of Cu, Au, Ag, Zn, Ga, $TiO_x$, ZnO, InO, SnO, GaN, ITO (indium tin oxide), $Al_2O_3$, and MgO. In a preferable embodiment, the nonmagnetic intermediate layer 140 is formed of a multilayer structure comprising two or more layers, for instance, a triple-layer structure film of Cu/ZnO/Cu. A triple-layer structure film of Cu/ZnO/Zn with Cu replaced by Zn is also preferable because of boosted-up output.

The nonmagnetic intermediate layer 140 has a thickness of about 0.5 to 5 nm.

(Explanation of One Modification to the Magnetoresistive Unit 8)

Figure 11:
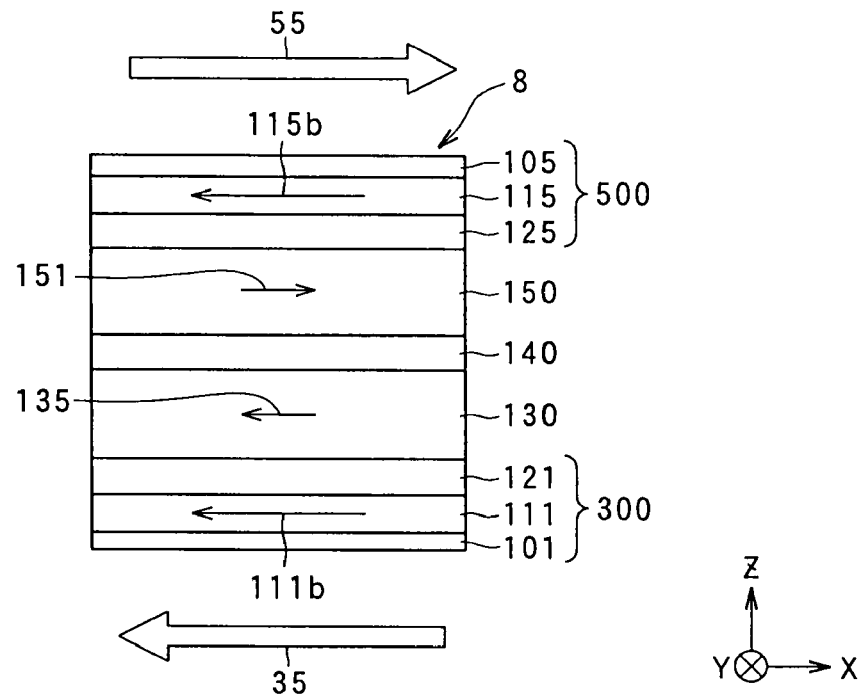
FIG. 11 is illustrative, as in FIG. 10, of a modification to the construction of the magnetoresistive unit.
Figure 12:
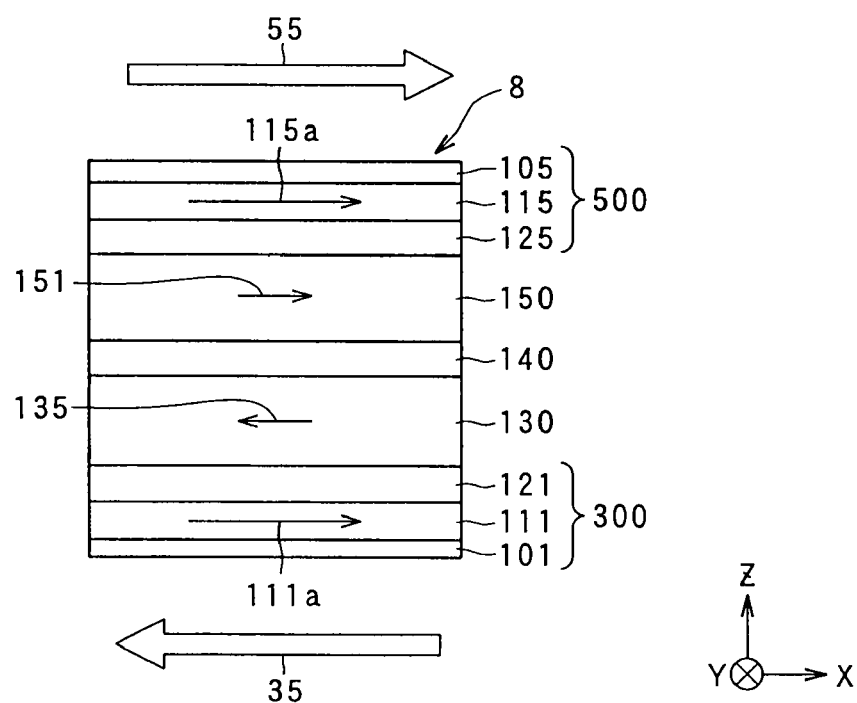
FIG. 12 is illustrative, as in FIG. 10, of a modification to the construction of the magnetoresistive unit.
Figure 13:
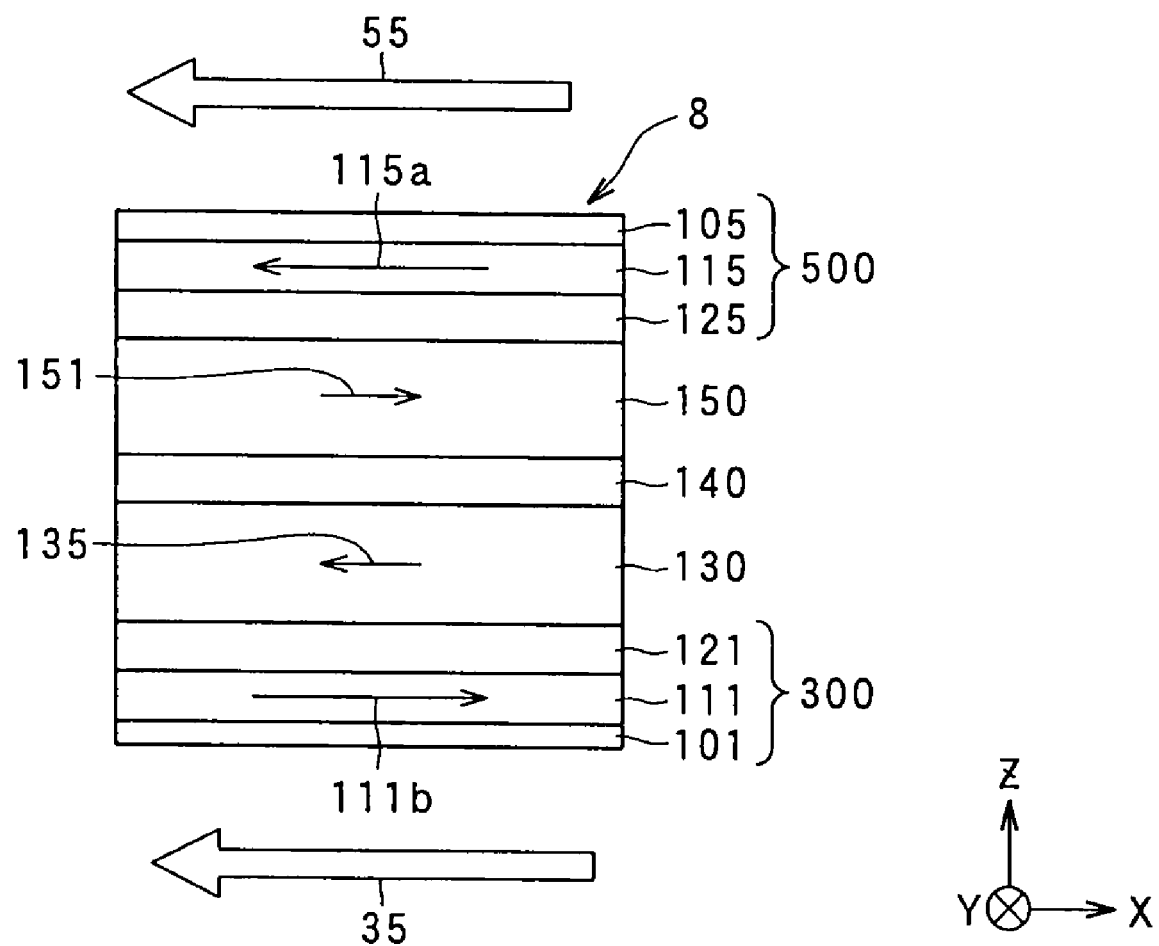
FIG. 13 is illustrative, as in FIG. 10, of a modification to the construction of the magnetoresistive unit.

FIGS. 11, 12 and 13 are illustrative, as in FIG. 10, of modifications to the construction of the magnetoresistive unit 8.

Commonly in any case, the first ferromagnetic layer 130 and the second ferromagnetic layer 150, one each functioning as the free layer, receive such action that there is an antiparallel magnetization state created, where their magnetizations are in the opposite directions, under the influences of magnetic actions from the first and second shield parallel layers 30 and 50 for the first and second shield layers 3 and 5, respectively. What is different is whether antiferromagnetic coupling or ferromagnetic coupling is to be used depending on the material and thickness specifications of the exchange coupling transfer layer 101, 105 and the exchange coupling adjustment layer 121, 125.

Figure 16:
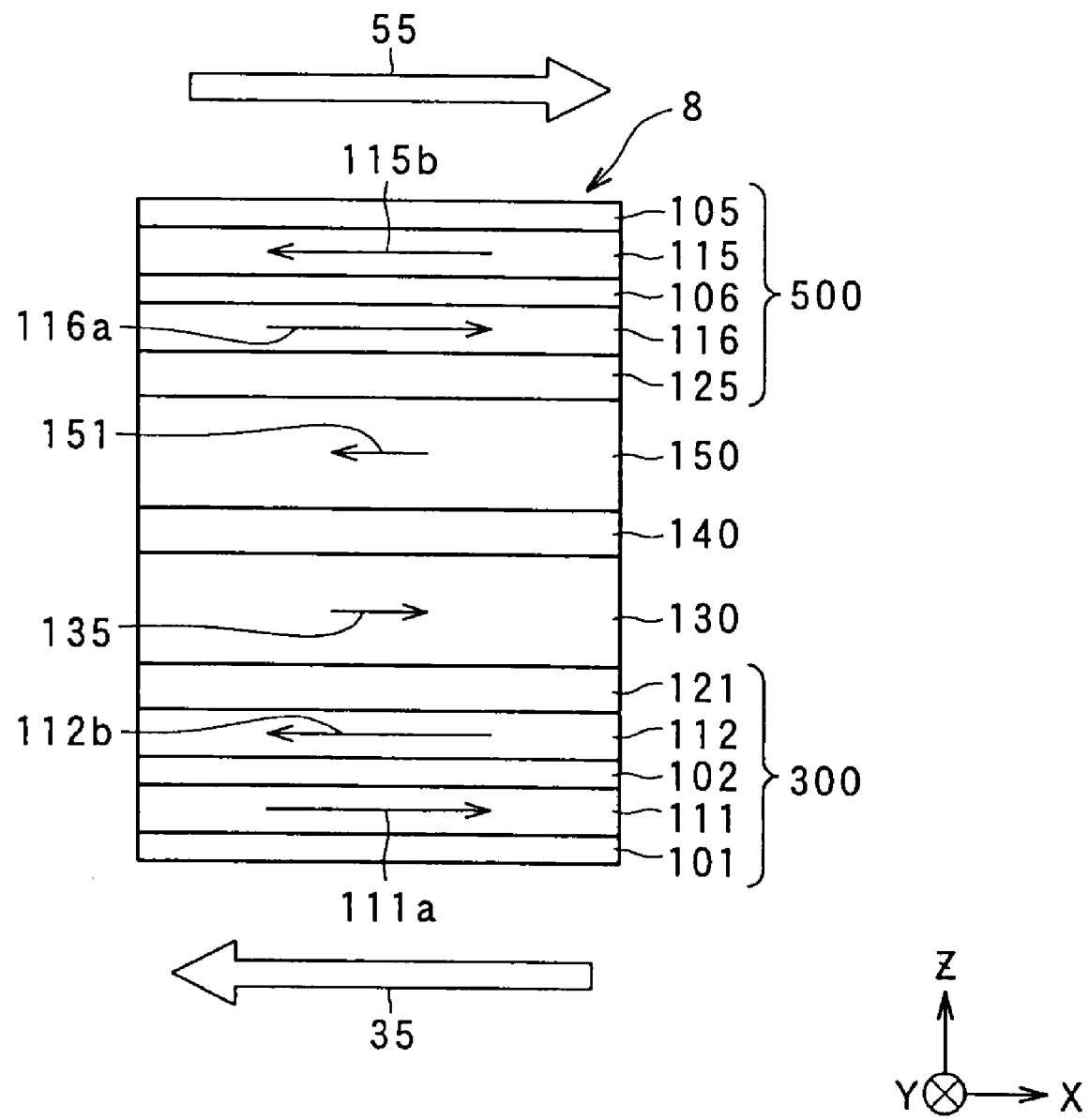
FIG. 16 is illustrative in section of a new modification to the construction of the magnetoresistive unit.

FIG. 16 is illustrative of another modification to the magnetoresistive unit 8. This modification is different from the aforesaid magnetoresistive unit 8 in terms of the construction of the first exchange coupling function gap layer 300, and the construction of the second exchange coupling function gap layer 500. That is, in FIG. 16, the first exchange coupling function gap layer 300 comprises, in order from the side of the first shield parallel layer 30 for the first shield layer 3, an exchange coupling transfer layer 101, a gap adjustment layer 111, an exchange coupling transfer layer 102, a gap adjustment layer 112, and an exchange coupling adjustment layer 121. On the other hand, the second exchange coupling function gap layer 500 comprises, in order from the side of the second shield parallel layer 50 for the second shield layer 5, an exchange coupling transfer layer 105, a gap adjustment layer 115, an exchange coupling transfer layer 106, a gap adjustment layer 116, and an exchange coupling adjustment layer 125. In this embodiment, too, the construction of each of the layers described as the exchange coupling transfer layer, gap adjustment layer and exchange coupling adjustment layer is the same as that of each of the exchange coupling transfer layer, gap adjustment layer and exchange coupling adjustment layer shown typically in FIGS. 10-12.

In the embodiment shown in FIG. 16, by (1) making strong antiferromagnetic coupling between two ferromagnetic layers, say, the gap adjustment layers 111 and 112 while both have the matching quantity of magnetization Mst, and (2) making strong antiferromagnetic coupling between two ferromagnetic layers, say, the gap adjustment layers 115 and 116 while both have the matching quantity of magnetization Mst, it is possible to reduce responses to the external magnetic field down to zero, thereby achieving more preferable advantages. Even when the coupling strength of the exchange coupling transfer layer is relatively weak, it is possible to make sure it has also a gap layer function. In the construction shown in FIG. 16, it is noted that the third peak of Ru may be used as the exchange coupling adjustment layer.

[Explanation of the Operation of the Magnetoresistive Device of Detecting the External Magnetic Field]

Figure 17A:
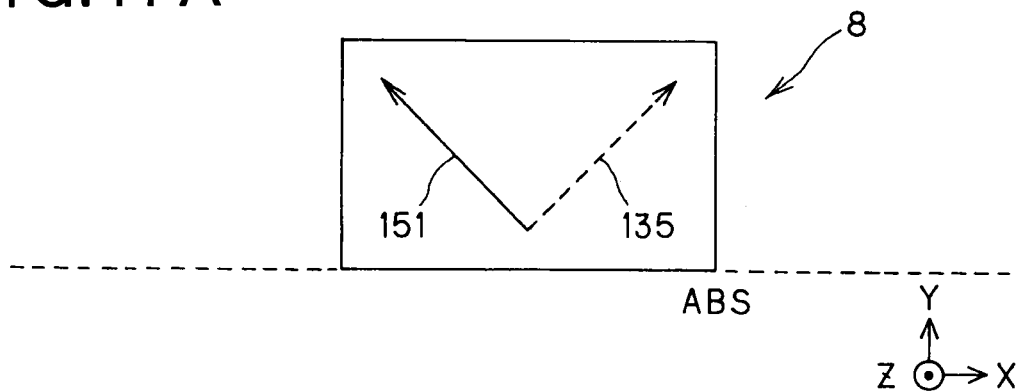
FIGS. 17A, 17B and 17C are models indicative of external magnetic field-depending changes in the state of magnetization where changes in the magnetoresistive of the inventive magnetoresistive device are obtainable.

The operation of the magnetoresistive device of the invention of detecting an external magnetic field is now explained with reference to FIGS. 17A, 17B and 17C.

Before the application of a bias magnetic field for placing magnetizations in the orthogonal directions, the first 130 and the second ferromagnetic layer 150 are each in an antiparallel magnetization state where their magnetizations are in the opposite directions under the influences of the magnetic actions of the first and second shield parallel layers 30 and 50 for the first 3 and the second shield layer 5, respectively.

Usually, through a bias magnetic field-applying means (not shown) such as a hard magnet located at the rear (the depth side: Y-direction) of the first 130 and the second ferromagnetic layer 150, a bias magnetic field is applied to the first 130 and the second ferromagnetic layer 150 so that the magnetizations 135 and 151 of the first 130 and the second ferromagnetic layer 150 are placed in substantially orthogonal directions, creating such a state as shown in FIG. 17A. This state defines the initial state of the magnetoresistive device (the magnetoresistive unit 8).

Figure 17B:
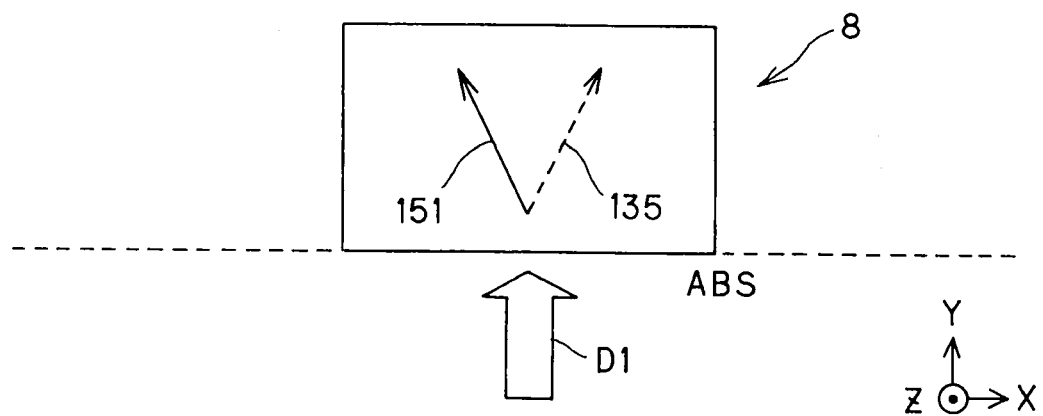

As an external magnetic field D1 flowing from the ABS into the device side is detected as shown in FIG. 17B, both the magnetizations 135 and 151 of the first 130 and the second ferromagnetic layer 150 tend to lie in the same direction so that the resistance of the device grows low.

Figure 17C:
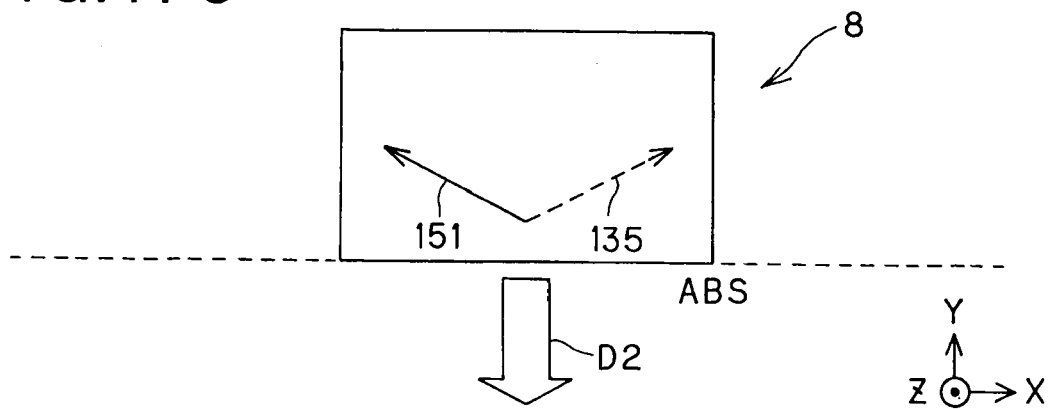

On the other hand, as an external magnetic field D2 in a direction away from the ABS is detected as shown in FIG. 17C, the magnetizations 135 and 151 of the first 130 and the second ferromagnetic layer 150 tend to lie in the opposite directions so that the resistance of the device grows high.

By measuring such a series of resistance changes with the external magnetic field, it is possible to detect the external magnetic field.

With regard to the inventive magnetoresistive device as described above, some modifications to the combined configuration of the first 3 with the second shield layer 5 are now explained.

Modification 1 (see FIGS. 8 and 9)

The basic structure of the device according to Modification 1 is substantially the same as the device configuration shown in FIGS. 1-7 with the exception that the first shield parallel layer 30 (identical with the first shield layer 3) that is located below is only slightly modified: it is cut out at given corners. That is, as shown in FIGS. 8 and 9, the corners of the first shield parallel layer 30 in the width (X) direction and facing the ABS (air bearing surface) side are cut off in the thickness direction to form cutout faces 30e of rectangular shape. By forming the cutout faces 30e of rectangular shape, the first shield parallel layer 30 has generally a modified hexagonal prism shape, as shown in FIGS. 8 and 9. By forming the rectangular cutout faces 30e, the magnetic path remains uninterrupted at a site where the end face 54a of the lower connecting layer 54 is in proximity to the end face 30a of the first shield parallel layer 30, keeping leakage magnetic fields substantially in check.

Modification 2 (see FIGS. 18, 19 and 20)

Referring to the basic structure of the device according to Modification 2, the width (W2) of the second shield parallel layer 50 that is located above is kept identical with the width (W1) of the first shield parallel layer 30 that is located below, as shown in FIG. 18. And both ends 51 of the second shield parallel layer 50 are provided with joining layers 52 that extend from both ends 51 down toward both ends 31 of the first shield parallel layer 30 that is positioned below. In this embodiment, the joining layers 52 are built up of only the side sheet layers 53 suspending down from both ends 51 of the second shield parallel layer 50; that is, the joining layers 52 are synonymous with the side sheet layers 53.

As shown in FIG. 18, between the end face 52a of each joining layer 52 and each end 31 of the first shield parallel layer 30 there is a nonmagnetic insulating layer 4a interposed. The interposition of the nonmagnetic insulating layer 4a permits the first 3 and the second shield layer 5 to be joined to each other, creating a substantially insulated, closed magnetic path as is the case with the aforesaid embodiment.

In this embodiment, the whole front surface 30f of the first shield parallel layer 30 that is located below constitutes the ABS (air bearing surface), as shown in FIG. 19. In a more preferable embodiment shown in FIG. 20, the front surface 30f of the first shield parallel layer 30 that is located below has its front center area 30cf positioned in front of the ends 31 that are both side areas, with the ABS (air bearing surface) defined by that front center area 30cf. This is to prevent the joining of the first shield parallel layer 30 to the joining layers 52 (side sheet layers 53) thereby getting around short circuits in the event that the ABS is finally polished for the formation of the MR height.

Figure 21:
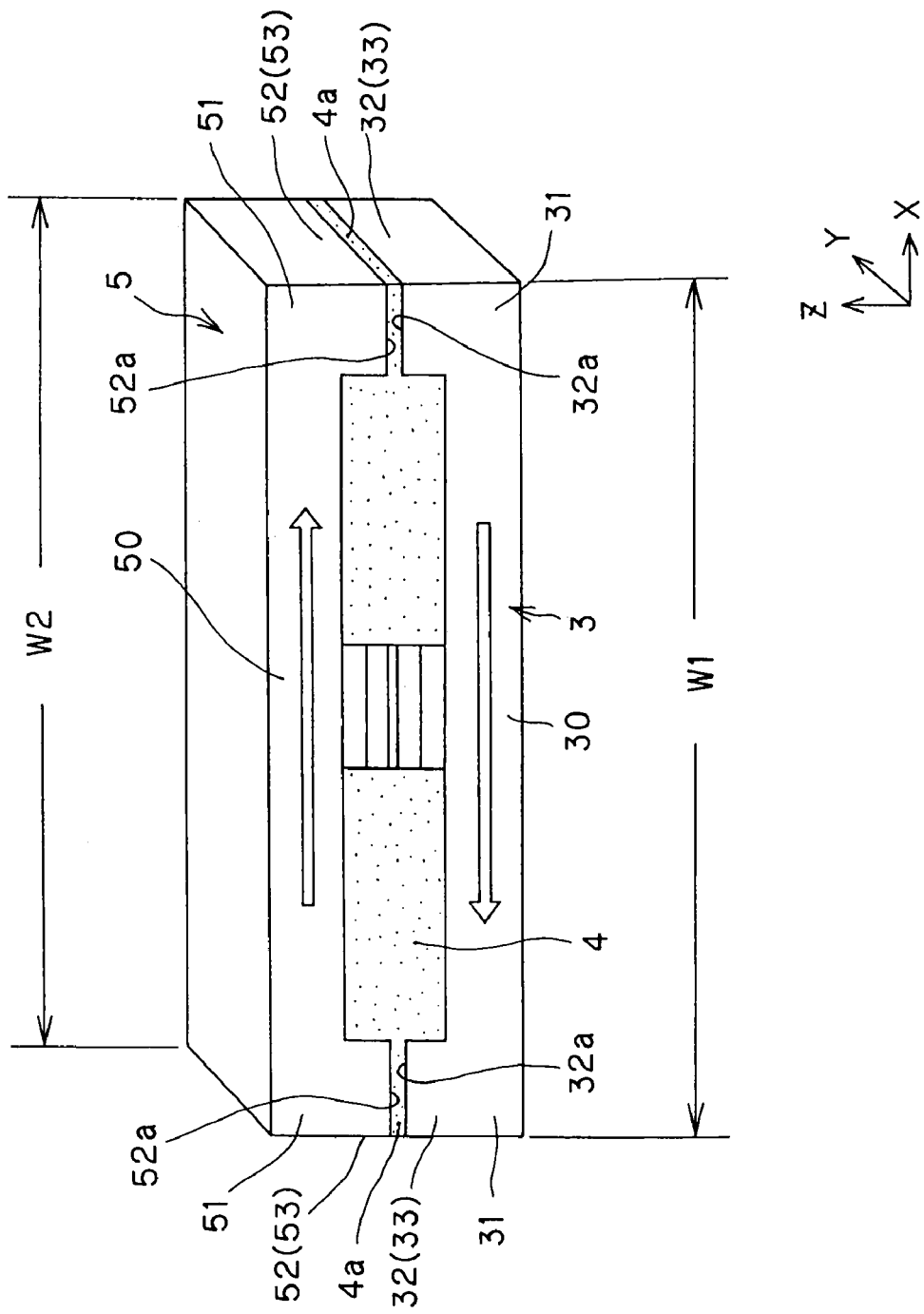
FIG. 21 is illustrative in perspective, as in FIG. 18, of a modification to FIG. 18.

Modification 3 (see FIG. 21)

Referring to the basic structure of the device according to Modification 3, the width (W2) of the second shield parallel layer 50 that is located above is kept identical with the width (W1) of the first shield parallel layer 30 that is located below, as shown in FIG. 21. And both ends 51 of the second shield parallel layer 50 are provided with joining layers 52 that extend substantially toward both ends 31 of the first shield parallel layer 30 that is positioned below. The joining layers 52 are built up of only the side sheet layers 53 suspending down from both ends 51 of the second shield parallel layer 50.

On the other hand, both ends 31 of the first shield parallel layer 30 are provided with joining layers 32 that extend from both ends 31 substantially toward both ends 51 of the second shield parallel layer 50 that is positioned above. The joining layers 32 are built up of only side sheet layers 33 that stand upright from both ends 31 of the first shield parallel layer 30.

Between the end face 52a of each joining layer 52 and the end face 32a of each joining layer 32 there is a nonmagnetic insulating layer 4a interposed. The interposition of the nonmagnetic insulating layers 4a permits the first 3 and the second shield layer 5 to be joined to each other, forming a substantially insulated, closed magnetic path as is the case with the aforesaid embodiment.

[Explanation of the Whole Structure of the Thin-Film Magnetic Head]

Figure 22:
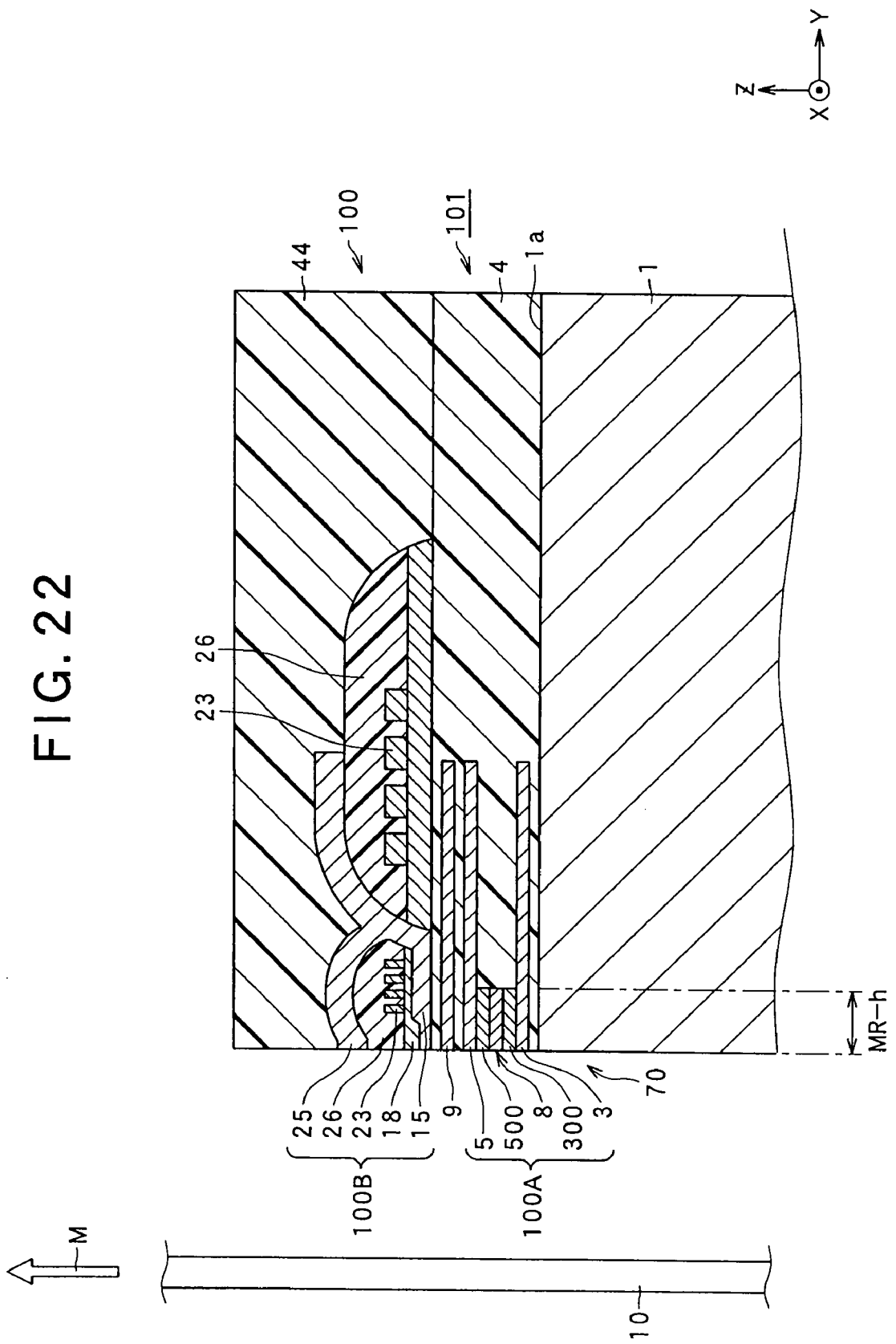
FIG. 22 is illustrative in section of the thin-film magnetic head orthogonal to the air bearing surface.

FIG. 22 is illustrative in section (section in the Y-Z plane) of a thin-film magnetic head parallel with the so-called air bearing surface (ABS).

A thin-film magnetic head 100 shown in FIG. 22 is used on a magnetic recording system such as a hard disk drive for the purpose of applying magnetic processing to a recording medium 10 like a hard disk moving in a medium travel direction M.

The thin-film magnetic head 100 illustrated in the drawing is a composite type head capable of implementing both recording and reproducing as magnetic processing. The structure comprises, as shown in FIG. 22, a slider substrate 1 made of a ceramic material such as AlTiC ($Al_2O_3$.TiC), and a magnetic head unit 101 formed on the slider substrate 1.

The magnetic head unit 101 has a multilayer structure comprising a reproducing head portion 100A adapted to implement reproducing process for magnetic information recorded by making use of the magnetoresistive (MR) effect and a shield type recording head portion 100B adapted to implement a perpendicular recording type recording processing.

A detailed account is now given below.

A first shield layer 3 and a second shield layer 5 are each a planar layer formed in such a way as to be almost parallel with the side 1a of the slider substrate 1, forming a part of the ABS that is a medium opposite plane 70.

A magnetoresistive unit 8 is disposed in such a way as to be held between the first 3 and the second shield layer 5, forming a part of the medium opposite plane 70. And a height in the perpendicular direction (Y-direction) to the medium opposite plane 70 defines an MR height (MR-h).

For instance, the first 3 and the second shield layer 5 are each formed by pattern plating inclusive of frame plating or the like. Although not clearly shown in the drawing, the first 1 and the second shield layer 5 must be set up in such a way as to have the aforesaid advantages of the invention.

The magnetoresistive unit 8 is a multilayer film formed in such a way as to be almost parallel with the side 1a of the slider substrate 1, forming a part of the medium opposite plane 70.

The magnetoresistive unit 8 is a multilayer film of the current-perpendicular-to-plane type (CPP type) with a sense current passing in the direction perpendicular to the staking plane. For instance, a tunnel magneto resistance (TMR) film or a CPP type GMR (giant magneto resistance) film is preferably used. By using such a magnetoresistive film as the magnetoresistive unit 8, signal magnetic fields from the magnetic disk can be sensed with very high sensitivity.

When the TMR device is used as the magnetoresistive unit 8, it comprises a structure wherein an anti-ferromagnetic layer, a fixed magnetization layer, a tunnel barrier layer and a free magnetization layer (free layer) are stacked up in order. For the antiferromagnetic layer, use is made of a film formed of IrMn, PtMn, NiMn, RuRhMn or the like and having a thickness of about 5 to 15 nm; for the fixed magnetization layer, for instance, CoFe or the like that is a ferromagnetic material or a synthetic pinned layer structure wherein a nonmagnetic metal layer such as Ru is sandwiched between two CoFe or like layers is exemplified; and for the tunnel barrier layer, use is made of a film obtained by the oxidization of an about 0.5 to 1-nm thick metal film comprising, for instance, Al, AlCu, and Mg. That oxidization may be carried out with oxygen introduced in vacuum equipment or by a natural oxidization process. The free magnetization layer (free layer), for instance, is a double-layer film made of an about 1-nm thick CoFe or the like that is a ferromagnetic material and an about 3 to 4-nm thick NiFe or the like. The free magnetization layer (free layer) makes a tunnel junction with the fixed magnetization layer by way of the tunnel barrier layer. When the so-called CPP type GMR film is used as the magnetoresistive unit 8, it has a structure wherein the tunnel barrier layer in the aforesaid TMR film is replaced by a nonmagnetic electroconductive layer made of Cu or the like and having a thickness of about 1 to 3 nm.

As shown in FIG. 22, between the first shield layer 3 and the magnetoresistive unit 8, and between the magnetoresistive unit 8 and the second shield layer 5, a lower metal gap layer (underlay layer) 121 and an upper metal gap layer (cap layer) 126 are interposed, respectively. Each layer 121, 126 is made of a non-magnetic material such as Ru, and Ta.

As also shown in FIG. 22, between the second shield layer 5 and the recording head portion 100B there is an inter-device shield layer 9 formed that is made of a similar material as the second shield layer 5 is.

The inter-device shield layer 9 keeps the magnetoresistive unit 8 functioning as a sensor out of a magnetic field occurring from the recording head portion 100B, taking a role in prevention of extraneous noises upon reading. Between the inter-device shield layer 9 and the recording head portion 100B there may also be a backing coil portion formed. The backing coil portion is to generate a magnetic flux that cancels out a magnetic flux loop that is generated from the recording head portion 100B, passing through the upper and lower electrode layers of the magnetoresistive unit 8: this backing coil portion works to hold back the wide adjacent track erasure (WATE) phenomenon that is unwanted writing or erasure operation with the magnetic disk.

At a gap between the first and second shield layers 3 and 5 on the side of the magnetoresistive unit 8 that faces away from the medium opposite plane 70, at the rear of the first and second shield layers 3, 5 and the inter-shield shield layer 9 that face away from the medium opposite plane 70, at a gap between the first shield layer 3 and the slider substrate 1, and at a gap between the inter-device shield layer 9 and the recording head portion 100B, there are insulating layers 4 and 44 formed, one each made of alumina or the like.

The recording head portion 100B is preferably constructed for the purpose of perpendicular magnetic recording, and comprises a main magnetic pole layer 15, a gap layer 18, a coil insulating layer 26, a coil layer 23 and an auxiliary magnetic pole layer 25, as shown in FIG. 22.

The main magnetic pole layer 15 is set up as a magnetic guide path for guiding a magnetic flux induced by the coil layer 23 to the recording layer of the magnetic recording medium 10 with information being to be written on it while converging that magnetic flux. At the end of the main magnetic pole layer 15 here that is on the medium opposite plane 70 side, the width in the track width direction (along the X-axis of FIG. 22) and the thickness in the stacking direction (along the Z-axis of FIG. 22) of the main magnetic pole layer 15 should preferably be less than those of the rest. Consequently, it is possible to generate a fine yet strong writing magnetic flux well fit for high recording densities.

The end on the medium opposite plane 70 side of the auxiliary magnetic pole layer 25 magnetically coupled to the main magnetic pole layer 15 forms a trailing shield portion having a layer section wider than that of the rest of the auxiliary magnetic pole layer 25. As shown in FIG. 22, the auxiliary magnetic pole layer 25 is opposed to the end of the main magnetic pole layer 15 on the medium opposite plane 70 side while the gap layer 18 made of an insulating material such as alumina and the coil insulating layer 26 are interposed between them.

By the provision of such auxiliary magnetic pole layer 25, it is possible to make steeper a magnetic field gradient between the auxiliary magnetic pole layer 25 and the main magnetic pole layer 15 near the medium opposite plane 70. Consequently, jitters of signal outputs diminish, resulting in the ability to minimize error rates upon reading.

The auxiliary magnetic pole layer 25, for instance, is formed at a thickness of, e.g., about 0.5 to 5 μm using frame plating, sputtering or the like. The material used may be an alloy comprising two or three of, for instance, Ni, Fe and Co, or comprising them as a main component with the addition of given elements to it.

The gap layer 18 is formed in such a way as to space the coil layer 23 away from the main magnetic pole layer 15. The gap layer 18 is constructed from $Al_2O_3$, DLC (diamond-like carbon) or the like having a thickness of, for instance, about 0.01 to 0.5 μm, and formed using, for instance, sputtering, CVD or the like.

[Explanation of the Head Gimbal Assembly and the Hard Disk System]

One each example of the head gimbal assembly and the hard disk system, used with the foregoing thin-film head mounted on it, is now explained.

A slider 210 included in the head gimbal assembly is first explained with reference to FIG. 23. In the hard disk system, the slider 210 is located in such a way as to face a hard disk that is a rotationally driven disk-form recording medium. This slider 210 primarily comprises a substrate 211 built up of a substrate and an overcoat.

The substrate 211 is in a generally hexahedral shape. Of the six surfaces of the substrate 211, one surface is in opposition to the hard disk. On that one surface there is a medium opposite plane 70 formed.

Figure 23:
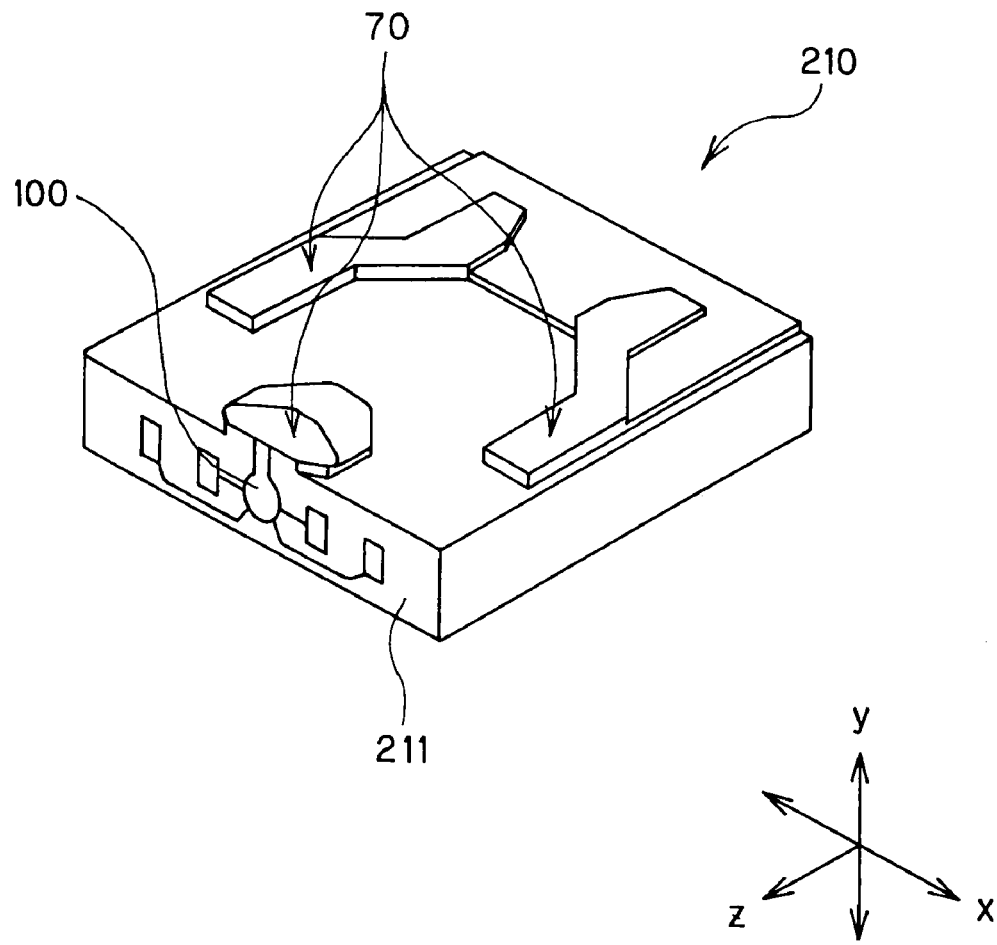
FIG. 23 is illustrative in perspective of the slider included in the head gimbal assembly according to one embodiment of the invention.

As the hard disk rotates in the z-direction in FIG. 23, it causes an air flow passing between the hard disk and the slider 210 to induce lift relative to the slider 210 in the downward y-direction in FIG. 23. This lift in turn causes the slider 210 to levitate over the surface of the hard disk. Note here that the x direction in FIG. 23 traverses tracks on the hard disk.

Near the end of the slider 210 on an air exit side (the left lower end in FIG. 23), there is a thin-film magnetic head formed according to the embodiment here.

A head gimbal assembly 220 according to this embodiment is now explained with reference to FIG. 24. The head gimbal assembly 220 comprises a slider 210 and a suspension 221 adapted to resiliently support that slider 210. The suspension 221 comprises a leaf spring-form load beam 222 made of typically stainless steel, a flexure 223 attached to one end of the load beam 222 and having the slider 210 joined to it for giving a suitable degree of flexibility to the slider 210, and a base plate 224 attached to the other end of the load beam 222.

The base plate 224 is adapted to be attached to an arm 230 of an actuator for moving the slider 210 in the track traverse direction x of the hard disk 262. The actuator comprises the arm 230 and a voice coil motor for driving that arm 230. At a portion of the flexure 223 having the slider 210 attached to it, there is a gimbal portion provided for keeping the posture of the slider 210 constant.

The head gimbal assembly 220 is attached to the arm 230 of the actuator. The head gimbal assembly 220 attached to one arm 230 is called a head arm assembly, whereas the head gimbal assembly 220 attached to a carriage at its plurality of arms is referred to as a head stack assembly.

Figure 24:
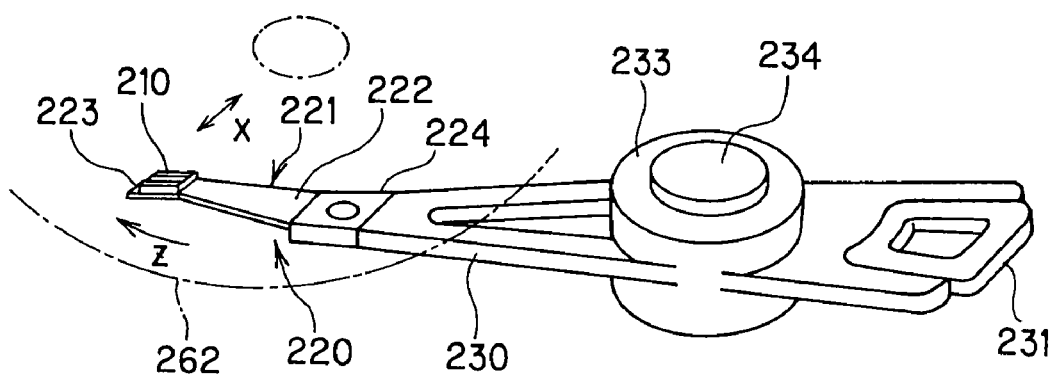
FIG. 24 is illustrative in perspective of the head arm assembly comprising the head gimbal assembly according to one embodiment of the invention.

FIG. 24 illustrates one example of the head arm assembly, wherein the head gimbal assembly 220 is attached to one end of the arm 230. To the other end of the arm 230, a coil 231 forming a part of the voice coil motor is attached. Halfway across the arm 230, there is a bearing portion 233 attached to a shaft 234 adapted to support the arm 230 in a pivotal fashion.

One each example of the head stack assembly and the hard disk system according to the embodiment here are now explained with reference to FIGS. 25 and 26.

Figure 25:
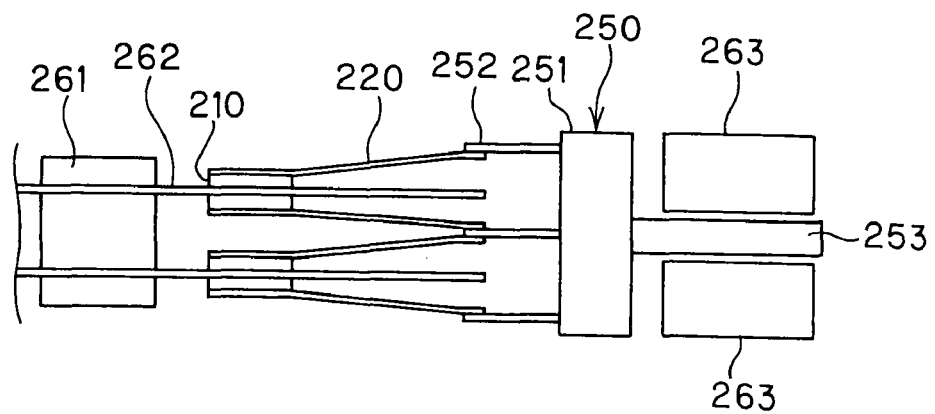
FIG. 25 is illustrative of part of the hard disk system according to one embodiment of the invention.
Figure 26:
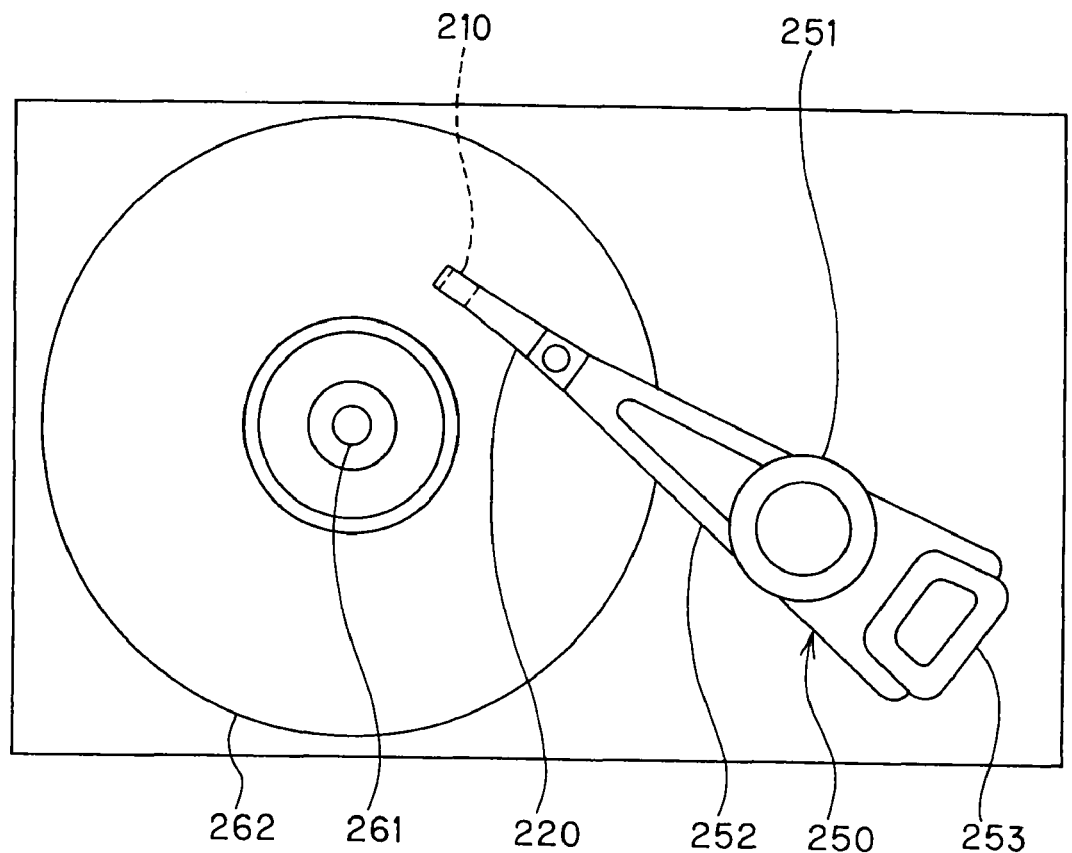
FIG. 26 is a plan view of the hard disk system according to one embodiment of the invention.

FIG. 25 is illustrative of part of the hard disk system, and FIG. 20 is a plan view of the hard disk system.

A head stack assembly 250 comprises a carriage 251 having a plurality of arms 252. The plurality of arms 252 are provided with a plurality of the head gimbal assemblies 220 such that they line up perpendicularly at an interval. On the side of the carriage 251 that faces away from the arms 252, there is a coil 253 attached, which coil becomes a part of the voice coil motor. The head stack assembly 250 is incorporated in the hard disk system.

The hard disk system comprises a plurality of hard disks 262 attached to a spindle motor 261. For each hard disk 262, two sliders 210 are located such that they are opposite to each other with the hard disk 262 held between them. The voice coil motor has also permanent magnets 263 located at opposite positions with the coil 253 of the head stack assembly 250 held between them.

The head stack assembly 250 except the slider 210 and the actuator correspond to the positioning device here which is operable to support the slider 210 and position it relative to the hard disk 262.

With the hard disk system here, the actuator is actuated to move the slider 210 in the track traverse direction of the hard disk 262, thereby positioning the slider 210 with respect to the hard disk 262. The thin-film magnetic head incorporated in the slider 210 works such that information is recorded by a recording head in the hard disk 262, and the information recorded in the hard disk 262 is played back by a reproducing head.

The head gimbal assembly and the hard disk system here have pretty much the same action as the thin-film magnetic head according to the foregoing embodiments.

While the embodiment here has been described with reference to the thin-film magnetic head of the structure wherein the reproducing head portion is located on the substrate side and the perpendicular recording head portion is stacked on the reproducing head, it is contemplated that that order of stacking could be reversed. When the thin-film magnetic head here is used as a read-only head, the recording head could be removed from it.

Specific Experiments

The magnetoresistive device of the invention is now explained in further details with reference to some specific experiments.

EXPERIMENTAL EXAMPLE 1

An experimental sample (the sample of Example 1) for the magnetoresistive device of such construction as shown in FIGS. 1-7 and 10 was prepared.

That is, a slider substrate was provided thereon with the first shield parallel layer 30 (synonymous with the first shield layer 3) made of NiFe and having a width of 30 μm (the X-axis direction size), a length of 3 μm (the Y-axis direction size) and a thickness of 100 nm (the Z-axis direction size), and on each side of the first shield parallel layer 30 there was the lower connecting layer 54 formed, which was made of NiFe and had a width of 10 μm (the X-axis direction size), a length of 2.5 μm (the Y-axis direction size) and a thickness of 100 nm (the Z-axis direction size), as shown in FIG. 5.

Then, the magnetoresistive unit 8 of such multilayer construction as set out in Table 1 was formed on the first shield parallel layer 30, as shown in FIG. 6, and the side sheet layer 53 made of NiFe was formed on the outer end of the lower connecting layer 54. The side sheet layer 53 had a width of 4 μm (the X-axis direction size) and a length of 3 μm (the Y-axis direction size). The side sheet layer 53 had the same thickness as that of the magnetoresistive unit 8.

As shown in FIG. 7, the second shield parallel layer 50 made of NiFe and having a width of 30 μm (the X-axis direction size), a length of 3 μm (the Y-axis direction size) and a thickness of 100 nm (the Z-axis direction size) was formed on the magnetoresistive unit 8 and side sheet layers 53.

Both sides of the magnetoresistive unit 8, the front surface of each lower connecting layer 54 and a gap (of 0.2 nm) between the first shield parallel layer 30 and each lower connecting layer 54 were insulated by alumina.

The first 3 and the second shield layer 5 each had a single domain structure through the shape anisotropy due to the aforesaid sizes, with the magnetization directions of the layers 3 and 5 being antiparallel with each other, as shown in FIGS. 1 and 8.

In the arrangement shown in Table 1, as shown in FIG. 10, the magnetization 35 of the first shield parallel layer 30 (synonymous with the first shield layer 3) was antiferromagnetically coupled to the magnetization 111a of the gap adjustment layer 111, and the magnetization 111a of the gap adjustment layer 111 was antiferromagnetically coupled to the magnetization 135 of the first ferromagnetic layer 130. Likewise, the magnetization 55 of the second shield parallel layer 50 was anti-ferromagnetically coupled to the 115b of the gap adjustment layer 115, and the magnetization 115b of the gap adjustment layer 115 was antiferromagnetically coupled to the magnetization 151 of the second ferromagnetic layer 150.

Using the magnetoresistive of the thus formed sample of Example 1, a signal magnetic field was detected from a medium corresponding to −400 Oe to 400 Oe. As a result, it has been confirmed that viable magnetic resistance changes are obtainable.

TABLE 1

| Multilayer Structure | | | Layer Material | Thickness (nm) |
|---|---|---|---|---|
| Second Shield Parallel Layer (50) | | | NiFe | 100 |
| Magnetoresistive Unit (8) | Second Exchange Coupling Gap Layer (500) | Exchange Coupling Transfer Layer (105) | Ru | 0.8 |
| | | Gap Adjustment Layer (115) | CoFe | 4.0 |
| | | Exchange Coupling Adjustment Layer (125) | Cu | 0.9 |
| | Sensor Area | Second Ferromagnetic Layer (150) | CoFe | 3.0 |
| | | Nonmagnetic Intermediate Layer (140) | Cu | 0.5 |
| | | | ZnO | 1.8 |
| | | | Cu | 0.5 |
| | | First Ferromagnetic Layer (130) | CoFe | 3.0 |
| | First Exchange Coupling Gap Layer (300) | Exchange Coupling Transfer Layer (121) | Cu | 0.9 |
| | | Gap Adjustment Layer (111) | CoFe | 4.0 |
| | | Exchange Coupling Adjustment Layer (101) | Ru | 0.8 |

TABLE 1-continued

| Multilayer Structure | Layer Material | Thickness (nm) |
|---|---|---|
| First Shield Parallel Layer (30) | NiFe | 100 |

EXPERIMENTAL EXAMPLE 2

In the Example 1 sample of the aforesaid Experimental Example 1, the material of which the non-magnetic intermediate layer 140 forming the sensor area was made was changed from the triple-layer structure of 0.5-nm thick Cu/1.8 nm-thick ZnO/0.5-nm thick Cu to 0.8-nm thick MgO.

In otherwise the same way as in the aforesaid Example 1, an experimental sample (Example 2 sample) for the magnetoresistive device was prepared.

Using the magnetoresistive of the thus formed Example 2 sample, a signal magnetic field was detected from a medium corresponding to −400 Oe to 400 Oe. As a result, it has been confirmed that viable magnetic resistance changes are obtainable.

EXPERIMENTAL EXAMPLE 3

In the Example 1 sample of the aforesaid Experimental Example 1, the multilayer construction of the first 300, and the second exchange coupling gap layer 500 was changed as set out in Table 2 given below to prepare an experimental sample (Example 3 sample) of the magnetoresistive device as embodied in FIG. 16.

In the arrangement enumerated in Table 2, the magnetization 35 of the first shield parallel layer 30 (synonymous with the first shield layer 3) is anti-ferromagnetically coupled to the magnetization 111a of the gap adjustment layer 111, the magnetization 111a of the gap adjustment layer 111 is anti-ferromagnetically coupled to the magnetization 112b of the gap adjustment layer 112, and the magnetization 112b of the gap adjustment layer 112 is antiferromagnetically coupled to the magnetization 135 of the first ferromagnetic layer 130, as shown in FIG. 16. Likewise, the magnetization 55 of the second shield parallel layer 50 is antiferromagnetically coupled to the magnetization 115b of the gap adjustment layer 115, the magnetization 115b of the gap adjustment layer 115 is antiferromagnetically coupled to the magnetization 116a of the gap adjustment layer 116, and the magnetization 116a of the gap adjustment layer 116 is antiferromagnetically coupled to the magnetization 151 of the second ferromagnetic layer 150.

In this Example 3 sample, (1) two ferromagnetic layers, say, the gap adjustment layers 111 and 112 have the matching quantity of magnetization Mst and are strongly antiferromagnetically coupled to each other, and (2) two ferromagnetic layers, say, the gap adjustment layers 115 and 116 have the matching quantity of magnetization Mst and are strongly antiferromagnetically coupled to each other.

Using the magnetoresistive of the thus formed Example 3 sample, a signal magnetic field was detected from a medium corresponding to −400 Oe to 400 Oe. As a result, it has been confirmed that viable magnetic resistance changes are obtainable.

TABLE 2

| Multilayer Structure | | | Layer Material | Thickness (nm) |
|---|---|---|---|---|
| | Second Shield Parallel Layer (50) | | NiFe | 100 |
| Magnetoresistive Unit (8) | Second Exchange Coupling Gap Layer (500) | Exchange Coupling Transfer Layer (105) | Ru | 0.8 |
| | | Gap Adjustment Layer (115) | CoFe | 2.0 |
| | | Exchange Coupling Transfer Layer (106) | Ru | 0.8 |
| | | Gap Adjustment Layer (116) | CoFe | 2.0 |
| | | Exchange Coupling Adjustment Layer (125) | Cu | 0.9 |
| | Sensor Area | Second Ferromagnetic Layer (150) | CoFe | 3.0 |
| | | Nonmagnetic Intermediate Layer (140) | Cu | 0.5 |
| | | | ZnO | 1.8 |
| | | | Cu | 0.5 |
| | | First Ferromagnetic Layer (130) | CoFe | 3.0 |
| | First Exchange Coupling Gap Layer (300) | Exchange Coupling Transfer Layer (121) | Cu | 0.9 |
| | | Gap Adjustment Layer (112) | CoFe | 2.0 |
| | | Exchange Coupling Transfer Layer (102) | Ru | 0.8 |
| | | Gap Adjustment Layer (111) | CoFe | 2.0 |
| | | Exchange Coupling Adjustment Layer (101) | Ru | 0.8 |
| First Shield Parallel Layer (30) | | | NiFe | 100 |

From the aforesaid results, the advantages of the invention would be undisputed.

That is, the present invention provides a magnetoresistive device of the CPP (current perpendicular to plane) structure, comprising a magnetoresistive unit, and a first shield layer and a second shield layer which are located and formed such that the magnetoresistive unit is sandwiched between them from above and below, with a sense current applied in the stacking direction, wherein said magnetoresistive unit comprises a non-magnetic intermediate layer, and a first ferromagnetic layer and a second ferromagnetic layer stacked and formed such that said nonmagnetic intermediate layer is sandwiched between them; said first shield layer and said second shield layer include a first shield parallel layer and a second shield parallel layer, respectively, between which said magnetoresistive unit is sandwiched from above and below; both ends of either one of said first shield parallel layer and said second shield parallel layer are provided with joining layers that extend from said both ends substantially toward both ends of the other shield parallel layer; a nonmagnetic insulating layer is interposed between ends of said joining layers and an end of said other shield parallel layer, and said first shield layer and said second shield layer are joined together by way of said nonmagnetic insulating layer, forming a substantially insulated, closed magnetic path; the first shield parallel layer for said first shield layer and the second shield parallel layer for said second shield layer are each controlled by magnetization direction control means in terms of magnetization direction; and said first ferromagnetic layer and said second ferromagnetic layer each receive action such that under the magnetic actions of the first shield parallel layer for said first shield layer and the second shield parallel layer for said second shield layer, there is an anti-parallel magnetization state created with their mutual magnetizations being in the opposite directions. It is thus possible to stabilize control of the domains of shield layers so that the outflow of a leakage magnetic field from shield layers, which may otherwise cause unwanted writing on a recording medium, is kept more in check, and improve more on the reliability of device operation.

Further, it is possible to achieve an antiparallel magnetization state for two ferromagnetic layers (free layers) with simple structure yet without being restricted by the material and specific structure of an intermediate film interposed between the two ferromagnetic layers (free layers), and to improve on linear recording densities by the adoption of a structure capable of making the "read gap length" (the gap between the upper and lower shield layers) narrow thereby meeting recent demands for ultra-high recording densities.

INDUSTRIAL APPLICABILITY

The present invention could be applied to the industry of magnetic disk systems comprising a magnetoresistive device operable to read the magnetic field intensity of magnetic recording media or the like as signals.

We claim:

1. A magnetoresistive device of a CPP (current perpendicular to plane) structure, comprising a magnetoresistive unit, and a first shield layer and a second shield layer which are located and formed such that the magnetoresistive unit is sandwiched between them from above and below, with a sense current applied in a stacking direction, characterized in that:
   said magnetoresistive unit comprises a non-magnetic intermediate layer, and a first ferromagnetic layer and a second ferromagnetic layer stacked and formed such that said nonmagnetic intermediate layer is sandwiched between them,
   said first shield layer and said second shield layer include a first shield parallel layer and a second shield parallel layer, respectively, between which said magnetoresistive unit is sandwiched from above and below,
   both ends of either one of said first shield parallel layer and said second shield parallel layer are provided with joining layers that extend from said both ends substantially toward both ends of the other shield parallel layer,
   a nonmagnetic insulating layer is interposed between ends of said joining layers and an end of said other shield parallel layer, and said first shield layer and said second shield layer are joined together by way of said nonmagnetic insulating layer, forming a substantially insulated, closed magnetic path,
   the first shield parallel layer for said first shield layer and the second shield parallel layer for said second shield layer are each controlled by magnetization direction control means in terms of magnetization direction, and
   said first ferromagnetic layer and said second ferromagnetic layer each receive action such that under magnetic actions of the first shield parallel layer for said first shield layer and the second shield parallel layer for said second shield layer, there is an anti-parallel magnetization state created with their mutual magnetizations being in opposite directions.

2. The magnetoresistive device according to claim 1, wherein said first ferromagnetic layer is magnetically coupled to the first shield parallel layer for said first shield layer having a controlled magnetization direction indirectly by way of a first exchange coupling function gap layer, and
   said second ferromagnetic layer is magnetically coupled to the second shield parallel layer for said second shield layer having a controlled magnetization direction indirectly by way of a second exchange coupling function gap layer.

3. The magnetoresistive device according to claim 2, wherein said first exchange coupling function gap layer comprises, in order from the first shield parallel layer side of said first shield layer, an exchange coupling transfer layer, a gap adjustment layer and an exchange coupling adjustment layer, and
   said second exchange coupling function gap layer comprises, in order from the second shield parallel layer side of said second shield layer side, an exchange coupling transfer layer, a gap adjustment layer and an exchange coupling adjustment layer.

4. The magnetoresistive device according to claim 3, wherein said exchange coupling transfer layer is made of at least one material selected from the group consisting of Ru, Rh, Ir, Cr, Cu, Ag, Au, Pt, and Pd,
   said gap adjustment layer is made up of a ferro-magnetic material, and
   said exchange coupling adjustment layer is made of at least one material selected from the group consisting of Ru, Rh, Ir, Cr, Cu, Ag, Au, Pt, and Pd.

5. The magnetoresistive device according to claim 2, wherein said first exchange coupling function gap layer comprises, in order from the first shield parallel layer side of said first shield layer, an exchange coupling transfer layer, a gap adjustment layer, an exchange coupling transfer layer, a gap adjustment layer, and an exchange coupling adjustment layer, and
   said second exchange coupling function gap layer comprises, in order from the second shield parallel layer side of said second shield layer, an exchange coupling transfer layer, a gap adjustment layer, an exchange coupling transfer layer, a gap adjustment layer, and an exchange coupling adjustment layer.

6. The magnetoresistive device according to claim 1, wherein the magnetization direction control means for controlling the magnetization direction of each of the first shield parallel layer for said first shield layer and the second shield parallel layer for said second shield layer is by a shape anisotropy function of said first shield layer and said second shield layer, or an exchange coupling function from an antiferromagnetic material.

7. The magnetoresistive device according to claim 6, wherein said first shield layer, and said second shield layer is allowed by said magnetization direction control means to have a single domain structure.

8. The magnetoresistive device according to claim 1, wherein said nonmagnetic intermediate layer is made up of a triple-layer structure film with ZnO located at the center thereof.

9. The magnetoresistive device according to claim 1, wherein:
   the width (W2) of said second shield parallel layer that is located above is larger than the width (W1) of said first shield parallel layer that is located below, both ends of said second shield parallel layer are provided with joining layers that extend from said both ends substantially toward both ends of said first shield parallel layer, said joining layers comprise side sheet layers suspending from both ends of said second shield parallel layer, and a lower connecting layer formed along said side sheet layers, said lower connecting layer is positioned flush with said first shield parallel layer that is located below, and extends toward both ends of said first shield parallel layer in a width direction, and the front surface of said lower connecting layer is positioned deeper (rearward) than the front surface of said first shield parallel layer.

10. The magnetoresistive device according to claim 9, wherein a nonmagnetic insulating layer is interposed between said lower connecting layer and said first shield parallel layer.

11. The magnetoresistive device according to claim 9, wherein the front surface of said first shield parallel layer constitutes an ABS (air bearing surface).

12. The magnetoresistive device according to claim 9, wherein the front surface of said lower connecting layer is positioned about 50 nm to 1 μm deeper (rearward) than the front surface of said first shield parallel layer.

13. The magnetoresistive device according to claim 9, wherein corners of said first shield parallel layer located below, which lie in the width direction and on the ABS (air bearing surface) side, are cut off along a thickness direction.

14. The magnetoresistive device according to claim 1, wherein:

the width (W2) of said second shield parallel layer positioned above is equal to the width (W1) of said first shield parallel layer positioned below, both ends of said second shield parallel layer are provided with joining layers that extend from said both ends substantially toward both ends of said first shield parallel layer, and said joining layers are side sheet layers suspending down from both ends of said second shield parallel layer.

15. The magnetoresistive device according to claim 14, wherein the front surface of said first shield parallel layer located below has its front center area positioned in front of both its side areas, and said front center area constitutes an ABS (air bearing surface).

16. The magnetoresistive device according to claim 15, wherein a nonmagnetic insulating layer is interposed between the lower ends of said side sheet layers and said first shield parallel layers.

17. A thin-film magnetic head, characterized by comprising:
a plane in opposition to a recording medium, and
a magnetoresistive as recited in claim 1, which is located near said medium opposite plane to detect a signal magnetic field from said recording medium.

18. A head gimbal assembly, characterized by comprising:
a slider including a thin-film magnetic head as recited in claim 17 and located in such a way as to oppose to a recording medium, and
a suspension adapted to resiliently support said slider.

19. A magnetic disk system, characterized by comprising:
a slider including a thin-film magnetic head as recited in claim 17 and located in such a way as to oppose to a recording medium, and
a positioning device adapted to support and position said slider with respect to said recording medium.

* * * * *